(12) United States Patent
Li et al.

(10) Patent No.: US 11,903,257 B2
(45) Date of Patent: *Feb. 13, 2024

(54) DISPLAY PANEL AND DISPLAY APPARATUS

(71) Applicant: Xiamen Tianma Micro-Electronics Co., Ltd., Xiamen (CN)

(72) Inventors: Jieliang Li, Xiamen (CN); Jiaxian Liu, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/150,953

(22) Filed: Jan. 6, 2023

(65) Prior Publication Data
US 2023/0157077 A1 May 18, 2023

Related U.S. Application Data

(63) Continuation of application No. 17/147,309, filed on Jan. 12, 2021, now Pat. No. 11,574,978.

(30) Foreign Application Priority Data

Oct. 23, 2020 (CN) .......................... 202011150331.5

(51) Int. Cl.
*H10K 59/121* (2023.01)
*G09G 3/3225* (2016.01)
(Continued)

(52) U.S. Cl.
CPC ....... *H10K 59/1216* (2023.02); *G09G 3/3225* (2013.01); *G09G 3/3266* (2013.01);
(Continued)

(58) Field of Classification Search
CPC .. G09G 3/3266; G09G 3/3225; G09G 3/3275; G09G 3/3233; G09G 2320/0238;
(Continued)

(56) References Cited

U.S. PATENT DOCUMENTS

2005/0243037 A1 * 11/2005 Eom .................... G09G 3/3233
345/76
2005/0285825 A1 12/2005 Eom et al.
(Continued)

FOREIGN PATENT DOCUMENTS

CN 110148610 A 8/2019

*Primary Examiner* — Shaheda A Abdin
(74) *Attorney, Agent, or Firm* — CHRISTENSEN O'CONNOR JOHNSON KINDNESS PLLC

(57) ABSTRACT

Provided are a display panel and a display apparatus. The display panel includes a driving array layer having functional layers and insulation layers. The driving array layer includes a first transistor, a second transistor, a first capacitor including a first plate and a second plate, and a second capacitor including a third plate and a fourth plate. An active layer of the first transistor contains silicon, and an active layer of the second transistor contains oxide semiconductor. The first plate and the second plate are located in two of the functional layers, respectively, and the third plate and the fourth plate are located in two of the functional layers, respectively.

17 Claims, 16 Drawing Sheets

(51) Int. Cl.
*G09G 3/3266* (2016.01)
*G09G 3/3275* (2016.01)
*H01L 27/12* (2006.01)

(52) U.S. Cl.
CPC ....... *G09G 3/3275* (2013.01); *H10K 59/1213* (2023.02); *G09G 2320/0626* (2013.01); *H01L 27/1225* (2013.01); *H01L 27/1255* (2013.01)

(58) Field of Classification Search
CPC ... G09G 2300/0417; G09G 2300/0819; G09G 2320/0626; G09G 2310/0286; G09G 2300/0861; G09G 2300/0852; H10K 59/1213; H10K 59/1216; H01L 27/1255; H01L 27/1225
See application file for complete search history.

(56) References Cited

U.S. PATENT DOCUMENTS

| | | |
|---|---|---|
| 2006/0001637 A1 | 1/2006 | Pak et al. |
| 2006/0077134 A1 | 4/2006 | Hector et al. |
| 2006/0077142 A1 | 4/2006 | Kwon |
| 2006/0097966 A1 | 5/2006 | Choi |
| 2006/0273999 A1 | 12/2006 | Yamazaki et al. |
| 2011/0089414 A1 | 4/2011 | Yamazaki et al. |
| 2011/0090213 A1 | 4/2011 | Han |
| 2014/0131666 A1* | 5/2014 | Song ................. H10K 50/858 257/40 |
| 2019/0181209 A1* | 6/2019 | Zhang ................ H10K 59/126 |

* cited by examiner

DISPLAY PANEL AND DISPLAY APPARATUS

CROSS-REFERENCE TO RELATED APPLICATIONS

This application is a continuation of U.S. patent application Ser. No. 17/147,309, filed on Jan. 12, 2021, which claims priority to Chinese Patent Application No. 202011150331.5, filed on Oct. 23, 2020. All of the above-mentioned patent applications are hereby incorporated by reference in their entireties.

TECHNICAL FIELD

The present application relates to the display technical field, and particularly, to a display panel and a display apparatus.

BACKGROUND

The organic light-emitting diodes (OLEDs) have characteristics of self-luminescence, rapid response, wide color gamut, large viewing angle, high brightness, etc., and can be applied in thin display apparatuses and flexible display apparatuses and gradually became the research focus in the field of the current display technology. When applied in the display field, it is necessary to provide a driving array layer in a display panel, to drive the organic light emitting diodes to emit light for displaying. The driving array layer includes a complex circuit structure including a plurality of transistors. Generally, the transistors of the circuit structure of the driving array layer are of the same type, and thus all the transistors can be fabricated by the same process, thereby simplifying a manufacturing process of the driving array layer. However, the transistors in the circuit structure may play different roles. If all the transistors are of the same type, it may be difficult to meet different requirements for characteristics of individual transistors in the circuit structure. Moreover, the freedom of setting other components in the circuit structure is restricted. Accordingly, other elements in the circuit structure are provided with less design freedom.

SUMMARY

In a first aspect, the present disclosure provides a display panel, including a driving array layer having functional layers and insulation layers. The driving array layer includes a first transistor, a second transistor, a first capacitor including a first plate and a second plate, and a second capacitor including a third plate and a fourth plate. An active layer of the first transistor contains silicon, and an active layer of the second transistor contains oxide semiconductor. The first plate and the second plate are located in two of the functional layers, respectively, and the third plate and the fourth plate are located in two of the functional layers, respectively.

In a second aspect, the present disclosure provides a display apparatus, including the display panel according to the first aspect.

BRIEF DESCRIPTION OF DRAWINGS

For clearly describing embodiments of the present disclosure and embodiments in the related art, accompanying drawings that are illustrating these embodiments are briefly introduced as below. The accompanying drawings described below illustrate some embodiments of the present disclosure. Based on these drawings, those skilled in the art can obtain other drawings.

DESCRIPTION OF EMBODIMENTS

In order to clarify objects, technical solutions and advantages of the embodiments of the present disclosure, the technical solutions in the embodiments of the present disclosure are described in detail in conjunction with the drawings in the present disclosure embodiments. The described embodiments are merely parts of, rather than all the embodiments of the present disclosure. On basis of the described embodiments in the present disclosure, other embodiments obtained by those skilled in the art shall fall within the protection scope of the present disclosure.

The terms used in the embodiments of the present disclosure are only for the purpose of describing specific embodiments, but not intended to limit the present disclosure. The singular forms of "a", "said" and "the" used in the embodiments of the present disclosure and the appended claims also include plural forms, unless the context clearly indicates otherwise.

In view of the technical problems in related art, an embodiment of the present disclosure provides a display panel. The display panel includes a driving array layer and a light-emitting device layer. The light-emitting device layer includes a plurality of light-emitting elements, and the light-emitting elements are organic light-emitting diodes. The driving array layer includes transistors of different types, which can satisfy different requirements for transistor performance in different circuit structures, while increasing a degree of positional freedom of the components in the circuit structure.

Figure 1:
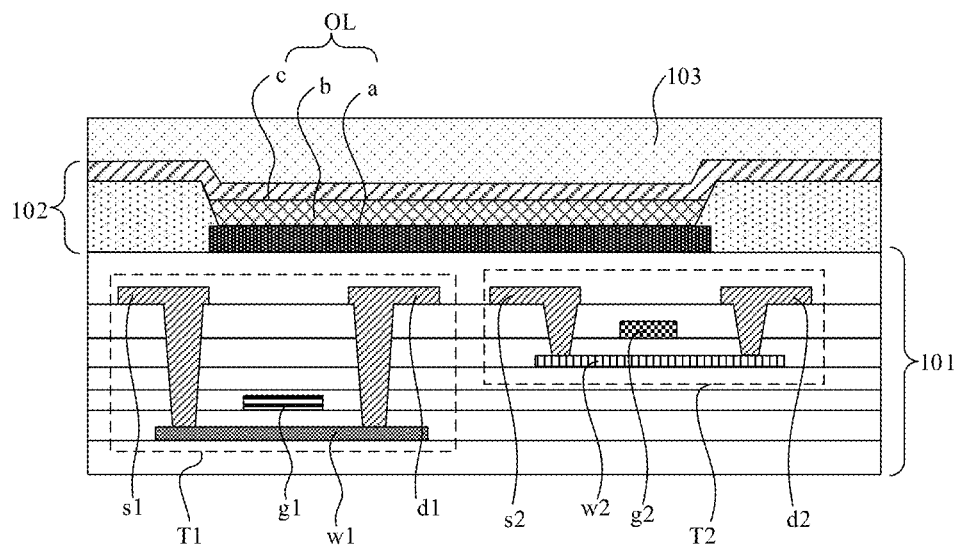
FIG. 1 is a schematic diagram of a layer structure of a display panel according to an embodiment of the present disclosure.

An embodiment of the present disclosure provides a display panel. FIG. 1 is a schematic diagram of a layer structure of a display panel according to an embodiment of the present disclosure. As shown in FIG. 1, the display panel includes a driving array layer 101, a light-emitting device layer 102, and an encapsulation layer 103 located on the light-emitting device layer 102. The driving array layer 101 includes functional layers and an insulation layer. Electrodes, wirings or capacitance plates of a circuit structure are provided in the functional layers. The insulation layer is configured to insulate the two functional layers from each other. As illustrated in FIG. 1, the driving array layer 101 includes a first transistor T1 and a second transistor T2. An active layer of the first transistor T1 is a first active layer w1 containing silicon, and an active layer of the second transistor T2 is a second active layer w2 containing oxide semiconductor. In other words, the first transistor T1 and the second transistor T2 are transistors of different types. In an embodiment, the first transistor T1 is a low temperature poly-silicon transistor, and the second transistor T2 is an oxide transistor. In this case, a layer where a first gate electrode g1 of the first transistor T1 is located, a layer where the first active layer w1 of the first transistor T1 is located, a layer where a second gate electrode g2 of the second transistor T2 is located, a layer structure of the second active layer w2 of the second transistor T2, layers where a first source electrode s1 and a first drain electrode d1 of the first transistor T1 and a second source electrode and a second drain electrode of the second transistor are located, are collectively referred-to as the functional layer. FIG. 1 merely exemplarily illustrates that the first transistor T1 and the second transistor T2 are both top-gate structures. In another embodiments, both the first transistor and the second transistor in the driving array layer are bottom-gate transistors. The driving array layer 101 can further include other unillustrated functional layers. The light-emitting device layer 102 includes light-emitting elements OL, one of which is illustrated in FIG. 1. Each light-emitting element OL includes an anode a, a light-emitting layer b, and a cathode c that are sequentially stacked. The encapsulation layer 103 is configured to encapsulate and protect the light-emitting elements OL, and the encapsulation layer 103 can be a rigid encapsulation including encapsulation glass, and the encapsulation glass is bonded and fixed to the driving array layer through a sealant. The encapsulation layer 103 can also be a flexible encapsulation including at least one organic encapsulation layer and at least one inorganic encapsulation layer.

In an embodiment of the present disclosure, the driving array layer 101 can further include a first capacitor and a second capacitor. The first capacitor includes a first plate and a second plate, and the second capacitor includes a third plate and a fourth plate. The first plate and the second plate are located in any two functional layers, respectively; and the third plate and the fourth plate are located in any two functional layers, respectively.

In the display panel provided in the embodiment of the present disclosure, the driving array layer includes the first transistor and the second transistor of different types, and thus the first transistor and the second transistor can provide different characteristic performances to satisfy the different requirements for the transistors in the circuit structure. In addition, by providing the first transistor and the second transistor, the layers of the driving array layer can be increased, the two plates of the first capacitor and the two plates of the second capacitor can be respectively provided in any layers of the functional layers of the driving array layer. In the present disclosure, depending upon the individual positions of the first capacitor and the second capacitor in the circuit structure, the plates of the capacitors can be flexibly provided in the functional layers, and thus the two plates of the first capacitor and the two plates of the second capacitor can be arranged in the functional layers with more freedom.

Figure 2:
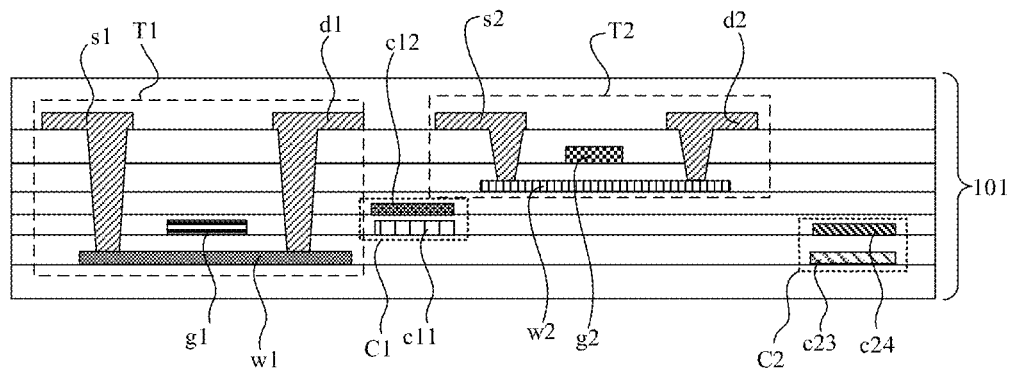
FIG. 2 is a schematic diagram of a layer structure of a display panel according to another embodiment of the present disclosure.

In an embodiment, one plate of the first capacitor and one plate of the second capacitor are located in the same functional layer. FIG. 2 is a schematic diagram of a layer structure of a display panel according to an embodiment of the present disclosure, in which only the driving array layer 101 is illustrated. A layer where a first gate electrode g1 of the first transistor T1 is located, a layer where the first active layer w1 of the first transistor T1 is located, a layer where a second gate electrode g2 of the second transistor T2 is located, a layer structure of the second active layer w2 of the second transistor T2, a layer where a first source electrode s1 and a first drain electrode d1 of the first transistor T1 are located, and a layer where a second source electrode s2 and a second drain electrode d2 of the second transistor T2 are located, are all referred to as the functional layer. Additionally, conductive layers can be provided in the driving array layer as functional layers. As shown in FIG. 2, a first capacitor C1 includes a first plate c11 and a second plate c12, and a second capacitor C2 includes a third plate c23 and a fourth plate c24. The first plate c11 and the third plate c23 are located in the same functional layer, while the second plate c12 and the fourth plate c24 are located in different functional layers. In an embodiment of the present disclosure, depending upon the connections between each of the circuit structures of the first capacitor C1 and the second capacitor C2 and other circuit elements such as transistors, the two plates of the first capacitor C1 are arranged in corresponding functional layers, and the two plates of the second capacitor C2 are arranged in corresponding functional layers. In the present embodiment, by arranging the first plate of the first capacitor and the third plate of the second capacitor in the same functional layer, the first plate and the third plate can be manufactured in one process. The second plate can be arranged in a corresponding functional layer according to a capacitance requirement of the first capacitor and the connection relationship between the first capacitor and the circuit elements, while the fourth plate can be arranged in a corresponding functional layer according to a capacitance requirement of the second capacitor and the connection relationship between the second capacitor and the circuit elements.

Figure 3:
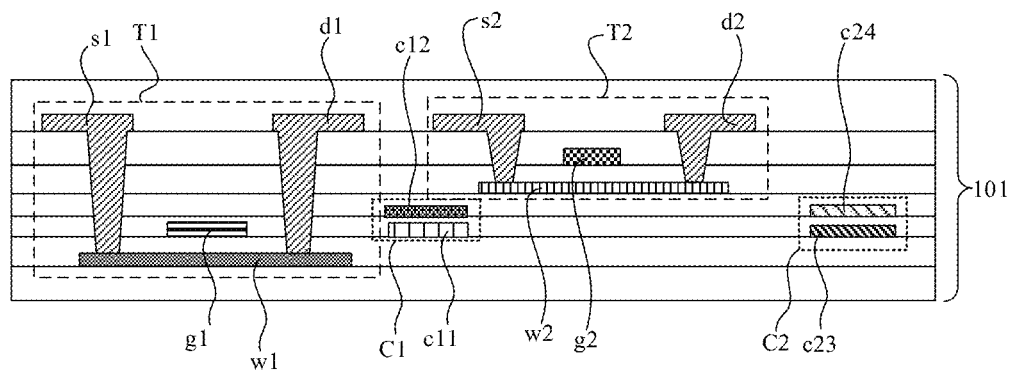
FIG. 3 is a schematic diagram of a layer structure of a display panel according to yet another embodiment of the present disclosure.

In another embodiment, one plate of the first capacitor and one plate of the second capacitor are located in the same functional layer, while the other one plate of the first capacitor and the other one plate of the second capacitor are located in the same functional layer. FIG. 3 is a schematic diagram of a layer structure of a display panel according to yet another embodiment of the present disclosure. As shown in FIG. 3, a first capacitor C1 includes a first plate c11 and a second plate c12, and a second capacitor C2 includes a third plate c23 and a fourth plate c24. The first plate c11 and the third plate c23 are located in the same functional layer, and the second plate c12 and the fourth plate c24 are located in the same functional layer. In the present embodiment, as the first plate and the third plate are located in the same functional layer, the first plate and the third plate can be manufactured in one process; and as the second plate and the fourth plate are located in the same functional layer, the second plate and the fourth plate can be manufactured in one process. Thus, the performance requirements of the first capacitor and the second capacitor can be satisfied, while reducing a thickness of the driving array layer.

Figure 4:
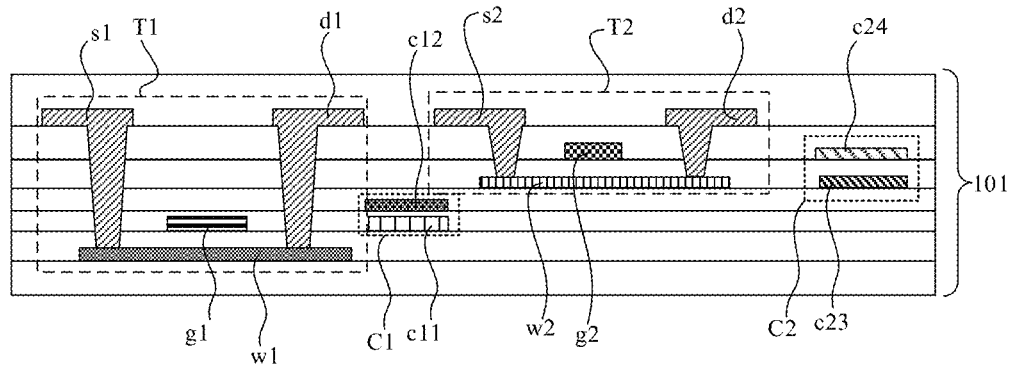
FIG. 4 is a schematic diagram of a layer structure of a display panel according to yet another embodiment of the present disclosure.

FIG. 4 is a schematic diagram of a layer structure of a display panel according to yet another embodiment of the present disclosure. As shown in FIG. 4, a first capacitor C1 includes a first plate c11 and a second plate c12, the second capacitor C2 includes a third plate c23 and a fourth plate c24. The first plate c11, the second plate c12, the third plate c23 and the fourth plate c24 are located in four different functional layers, respectively. In the present embodiment, the first plate and the second plate can be respectively arranged in corresponding functional layers according to a capacitance requirement of the first capacitor and the connection relationship between the first capacitor and the circuit elements, while the third plate and the fourth plate can be respectively arranged in corresponding functional layers according to a capacitance requirement of the second capacitor and the connection relationship between the second capacitor and the circuit elements. In this way, the design freedom of the first capacitor and the second capacitor is increased, and the first capacitor and the second capacitor are applicable to more circuit structures.

Figure 5:
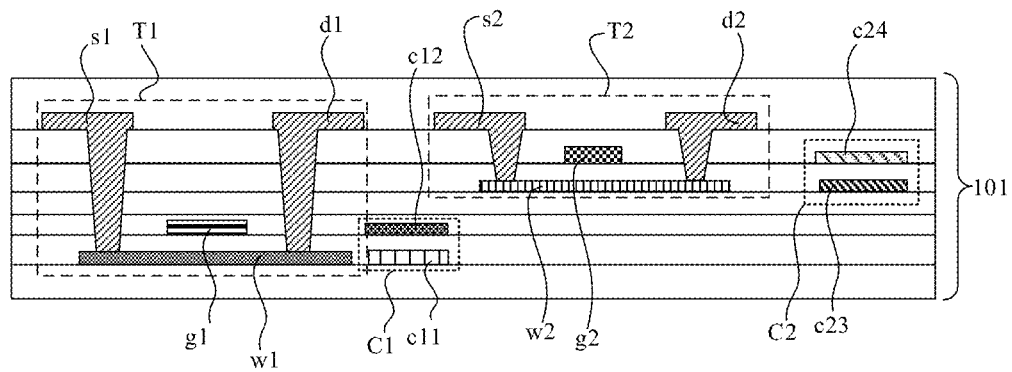
FIG. 5 is a schematic diagram of a layer structure of a display panel according to yet another embodiment of the present disclosure.

In an embodiment, the plate of the first capacitor and/or the second capacitor can be arranged in the same layer as is the active layer of the transistor. The plate of the capacitor can be arranged in the same layer as the first active layer of the first transistor or as the second active layer of the second transistor. As illustrated in FIG. 4, the third plate c23 of the second capacitor C2 is arranged in the same layer as the second active layer w2 of the second transistor T2. FIG. 5 is a schematic diagram of a layer structure of a display panel according to an embodiment of the present disclosure. In the embodiment as shown in FIG. 5, the driving array layer 101 includes a first transistor T1 and a second transistor T2, an active layer of the first transistor T1 is a first active layer w1 containing silicon, and an active layer of the second transistor T2 is a second active layer w2 containing oxide semiconductor. A first plate c11 of a first capacitor C1 is provided in the same layer as the first active layer w1, and a second plate c12 of the first capacitor C1 is provided in the same layer as a first gate electrode g1 of the first transistor T1. A third plate c23 of a second capacitor C2 is provided in the same layer as the second active layer w2, and a fourth plate C24 of the second capacitor C2 is provided in the same layer as the second gate electrode g2. In the manufacturing process, a pattern of the first plate c11 is formed simultaneously with a patterning process of a silicon-containing semiconductor material of the first active layer w1. Then the pattern of the first plate c11 is treated with an ion doping process to increase a conductivity of the first plate c11. The first active layer w11 includes a channel region and an electrode contact region. A first source electrode s1 and a first drain electrode d2 of the first transistor T1 are electrically connected to different electrode contact regions, respectively, and after the patterning process, the silicon-containing semiconductor material is treated with the ion doping process to increase the conductivity thereof, so as to form the electrode contact region. Thus, the ion doping process of the first plate c11 and an ion doping process of the electrode contact regions can be performed simultaneously without an additional process of manufacturing the first plate c11. Similarly, a pattern of the third s23 is formed simultaneously with a patterning process of the second active layer w2 made of the oxide semiconductor, and after the patterning process, a conduction processing is performed on a partial region of the second active layer w2 to form the electrode contact regions, and a conduction processing of the third plate c23 and the conduction processing of the second active layer w2 can be performed simultaneously, such that the third plate c23 can be manufactured without requiring additional processes.

In an embodiment, the first capacitor has a greater capacitance than the second capacitor. By providing the first capacitor and the second capacitor with different capacitances in the driving array layer, the driving array layer can meet the requirements for capacitances of capacitors in different circuit structures in the driving array layer, or the requirements for capacitances of capacitors in different functional modules in the same circuit structure. In practical applications, the capacitances of the first capacitor and the second capacitor can be adjusted according to specific requirements on circuits.

Figure 6:
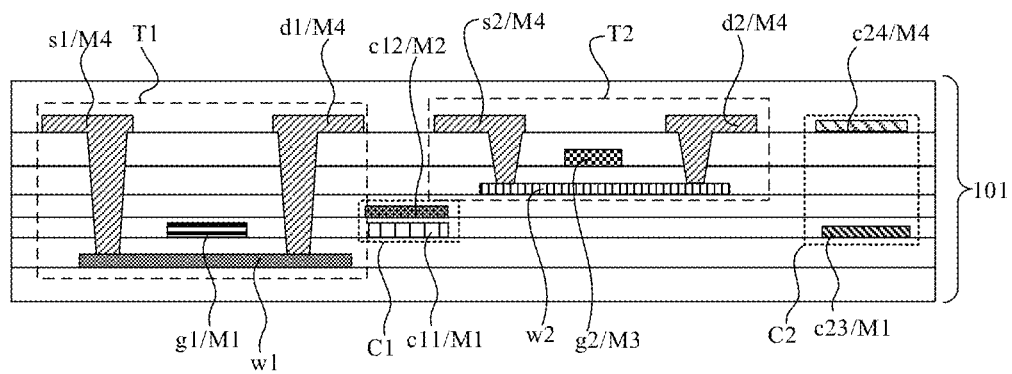
FIG. 6 is a schematic diagram of a layer structure of a display panel according to yet another embodiment of the present disclosure.

FIG. 6 is a schematic diagram of a layer structure of a display panel according to an embodiment of the present disclosure. In an embodiment, as shown in FIG. 6, the driving array layer 101 includes a first metal layer M1, a second metal layer M2, a third metal layer M3, and a fourth metal layer M4 that are sequentially arranged in a direction facing away from a base substrate 110. The first gate electrode g1, the first plate c11 of the first capacitor C1, the third plate c23 of the second capacitor C2 are located in the first metal layer M1. The second plate c12 of the first capacitor C1 is located in the second metal layer M1. The second gate electrode g2 of the second transistor is located in the third metal layer M3. A first source electrode s1 and a first drain electrode d1 of the first transistor T1, a second source electrode s2 and a second drain electrode d2 of the second transistor T2, and a fourth plate c24 of the second capacitor C2 are all located in the fourth metal layer M4. No additional processing steps are added in the manufacturing of the plates of the capacitors, and the layers where the plates of the capacitor are located can be set to adjust a distance between the two plates of the capacitor, thereby meeting the requirements for the capacitance of the capacitor.

It should be understood that in the embodiment shown in FIG. 6, the first to fourth metal layers are named merely for distinguishing the respective layers where each electrode structure is located. In an embodiment, the second transistor includes a second gate electrode and a third gate electrode, the second active layer is disposed between the second gate electrode and the third gate electrode, the second gate electrode is located in the second metal layer, and the third gate electrode is located in the third metal layer. The description regarding the embodiment shown in FIG. 6 is in accordance to the structure described in following embodiments. The specific embodiments of the present disclosure shall be understood with reference to specific positions of layers and specific structures of the transistors.

Figure 7:
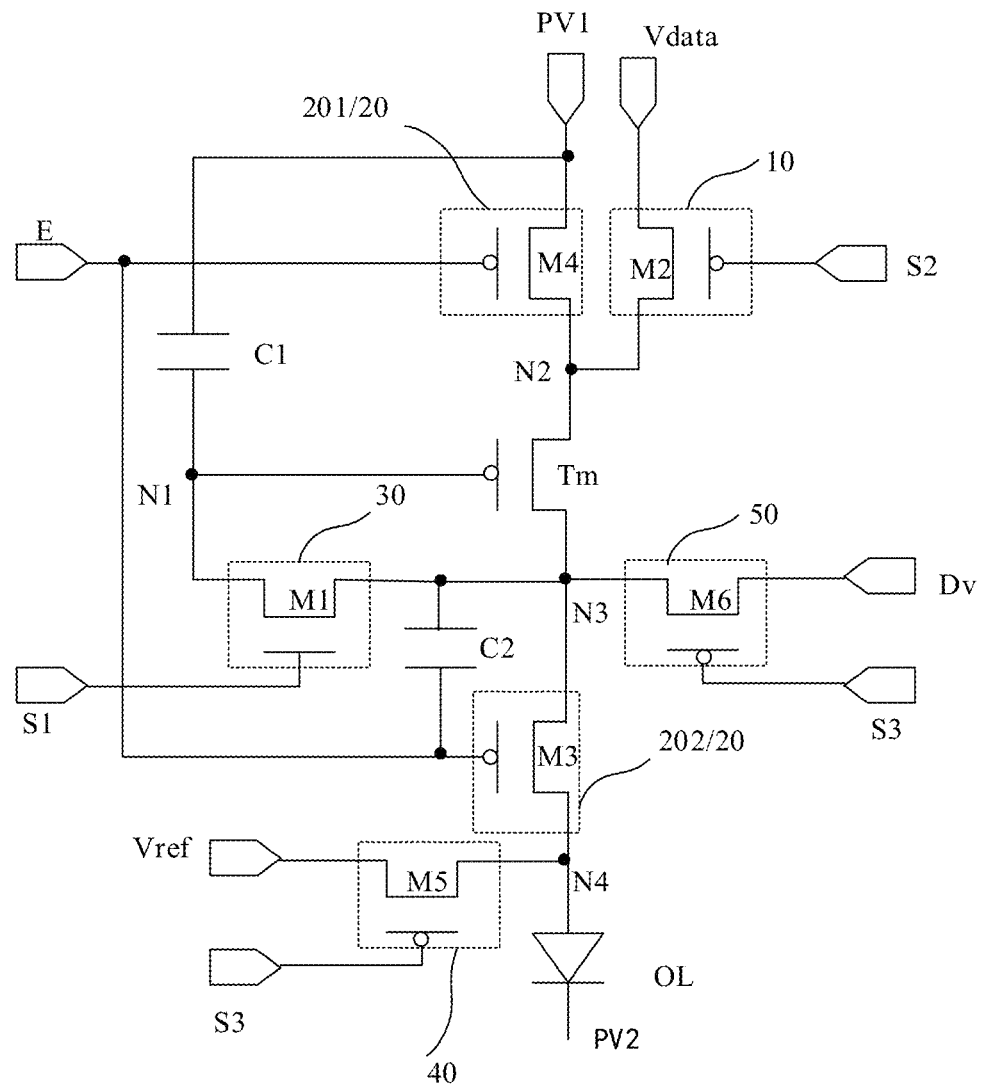
FIG. 7 is a schematic diagram of a pixel circuit of a display panel according to an embodiment of the present disclosure.

In an embodiment, the driving array layer includes a pixel circuit, and the pixel circuit includes a driving transistor. FIG. 7 is a schematic diagram of a pixel circuit of a display panel according to an embodiment of the present disclosure. FIG. 7 illustrates a light-emitting element OL electrically connected to the pixel circuit. The pixel circuit includes a first capacitor C1 and a second capacitor C2. The first capacitor C1 is connected between a first power signal terminal PV1 and a gate electrode of the driving transistor Tm, and is configured to store signals transmitted to the gate electrode of the driving transistor Tm. As illustrated in FIG. 7, the pixel circuit includes a data writing module 10, light emission control modules 20, a threshold compensation module 30, a light-emitting element reset module 40 and a bias adjustment module 50, as well as a first node N1, a second node N2, a third node N3 and a fourth node N4. FIG. 7 also illustrates a light-emission control terminal E, a first scanning signal terminal S1, a second scanning signal terminal S2, a third scanning signal terminal S3, a data signal terminal Vdata, a reset signal terminal Vref, and a bias adjustment signal terminal Dv.

As shown in FIG. 7, the driving transistor Tm has a control terminal (the gate electrode) connected to the first node N1, a first electrode connected to the second node N2, and a second electrode connected to the third node N3. The data writing module 10 has a first terminal connected to the data signal terminal Vdata, a second terminal connected to the second node N2 and a control terminal connected to the second scanning signal terminal S2, and the data writing module 10 is configured to write data signals. The threshold compensation module 30 has a first terminal connected to the first node N1, a second terminal connected to the third node N3, and a control terminal connected the first scanning signal terminal S1.

For example, the light emission control modules 20 include a first light emission control module 201 and a second light emission control module 202. A first terminal of the light emission control module 201 is connected to the first power signal terminal PV1, a second terminal of the light emission control module 201 is connected to the second node N2, a first terminal of the second light emission control module 202 is connected to the third node N3, and a second terminal of the second light emission control module is connected to the fourth node N4. A control terminal of the first light emission control module 201 and a control terminal of the second light emission control module 202 are both connected to the light-emission control terminal E. The light emission control module 20 is configured to control the light-emitting element OL to emit or not to emit light.

Referring to FIG. 7, for example, the pixel circuit of the display panel further includes a bias adjustment module 50, and the bias adjustment module 50 has a first terminal connected to the bias adjustment signal terminal Dv, a second terminal connected to the third node N3, and a control terminal connected to the third scanning signal terminal S3. The bias adjustment module 50 is configured to adjust a bias state of the driving transistor.

In an embodiment, the pixel circuit further includes a storage capacitor, the storage capacitor has a first terminal connected to a first power signal terminal PV1 and a second terminal connected to the first node N1, and the storage capacitor is configured to stabilize a potential of the gate electrode of the driving transistor Tm.

In the embodiment shown in FIG. 7, for example, the first capacitor C1 is a storage capacitor, one plate of the second capacitor C2 is connected to the third node N3, and the other plate thereof is connected to the light-emission control terminal E1. In this embodiment, the pixel circuit includes the first capacitor and the second capacitor, the first capacitor is the storage capacitor, and the second capacitor is an auxiliary capacitor and is configured to pull up a potential of the third node N3 when the signal provided by the light-emission control terminal E is a rising edge, such that the potential of the third node N3 is higher than that of the first node N1. In this way, the bias state of the driving transistor Tm can be adjusted, thereby improving a threshold shift caused by a hysteresis effect that is generated by a forward bias of the driving transistor Tm in a light-emitting stage. FIG. 7 merely illustrates the connection between the first capacitor and the circuit elements of the pixel circuit and the connection between the second capacitor and the circuit elements of the pixel circuit. In other embodiments, the second capacitor is a storage capacitor and the first capacitor is an auxiliary capacitor. In the following embodiments regarding the pixel circuit, the connection between the capacitors (i.e., the first capacitor and the second capacitor) and the circuit elements of the pixel circuit, and the role of the capacitors of the pixel circuit will be described in detail with examples.

Figure 8:
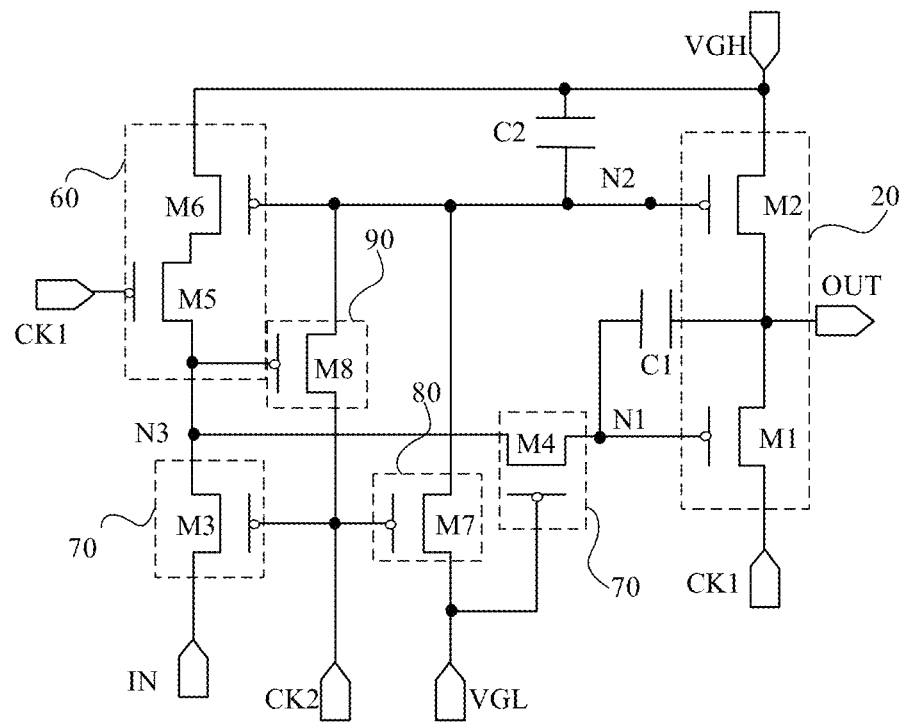
FIG. 8 is a schematic diagram of a driving circuit according to an embodiment of the present disclosure.

In another embodiment, a driving array layer includes a driving circuit, and the driving circuit provides a control signal for the pixel circuit of the display panel. For example, as the pixel circuit shown in FIG. 7, the light-emission control terminal E1, the scanning control terminal S1, the scanning control terminal S2 and the scanning control terminal S3 are respectively provided with signals by different driving circuits. FIG. 8 is a schematic diagram of a driving circuit according to an embodiment of the present disclosure. As shown in FIG. 8, the driving circuit includes an output terminal OUT and an output module 20, the driving circuit further includes a first capacitor C1 and a second capacitor C2, the first capacitor C1 is connected between a control terminal of the output module 20 (i.e., the first node N1 in the circuit) and the output terminal OUT. The output module 20 includes a first transistor M1 and a second transistor M2. The first transistor M1 has a control terminal electrically connected to the first node N1, a first terminal electrically connected to a clock signal terminal CK1, and a second terminal electrically connected to the output terminal OUT. The second transistor M2 has a control terminal electrically connected to the second node N2, a first terminal electrically connected to a level signal terminal VGH, and a second terminal electrically connected to the output terminal OUT.

FIG. 8 also illustrates a first input module 70, a second input module 80, a first protection module 60 and a second protection module 90 of the driving circuit. The first input module 70 includes a third transistor M3 and a fourth transistor M4. The third transistor M3 has a control terminal electrically connected to the clock signal terminal CK2, a first terminal electrically connected to an input terminal IN, and a second terminal electrically connected to the third node N3. The fourth transistor M4 has a control terminal electrically connected to the level signal terminal VGL, a first terminal electrically connected to the third node N3, and a second terminal electrically connected to the first node N1. The first input module 70 is configured to write a voltage signal to the first node N1. The second input module 80 includes a seventh transistor M7. The seventh transistor M7 has a control terminal electrically connected to the clock signal terminal CK2, a first terminal electrically connected to the level signal terminal VGL, and a second terminal electrically connected to the second node N2. The second input module 80 is configured to write a voltage signal to the second node N2. The first protection module 60 includes a fifth transistor M5 and a sixth transistor M6. The fifth transistor M5 has a control terminal electrically connected to the clock signal terminal CK1, a first terminal electrically connected to a second terminal of the sixth transistor M6, and a second terminal electrically connected to the third node N3. A control terminal of the sixth transistor M6 is electrically connected to the second node N2, and a first terminal of the sixth transistor M6 is electrically connected to the level signal terminal VGH. The first protection module 60 is configured to provide a high-level signal to the first node N1 when the second node N2 is at a low level, which can respectively provide two opposite levels to the first node N1 and the second node N2. The second protection module 90 includes an eighth transistor M8. The eighth transistor M8 has a control terminal electrically connected to the third node N3, a first terminal electrically connected to the clock signal terminal CK2, and a second terminal electrically connected to the second node N2. The second protection module 90 is configured to provide a high-level signal to the second node when the first node N1 is at a low level, which can respectively provide two opposite levels to the first node N1 and the second node N2.

In the present embodiment, the circuit structure is merely illustrative, and is not intended to limit the present disclosure. For the purpose of describing the position of the first capacitor in the driving circuit, the first capacitor is connected between the control terminal and the output terminal of the output module, and the first capacitor is configured to stabilize the potential of the control terminal of the output module, so as to ensure that the output terminal can output the corresponding level signal stably. The connection between the second capacitor and other functional modules of the driving circuit is not specifically limited in the present disclosure. Based on the present disclosure, in the driving circuit including the first capacitor and the second capacitor, the functional layers where the two plates of the first capacitor are located can be selected according to the requirements for the capacitance of the first capacitor in the circuit structure as well as the connection relationship between the first capacitor and other circuit components. Meanwhile, the functional layers where the two plates of the second capacitor are located can be selected according to the requirements for the capacitance of the second capacitor in the circuit structure as well as the connection relationship between the second capacitor and other circuit components.

In another embodiment, the driving array layer includes a pixel circuit and a driving circuit, and the driving circuit is configured to provide a control signal for the pixel circuit. The pixel circuit includes a first capacitor, and the driving circuit includes a second capacitor. The first capacitor of the pixel circuit can be the capacitor connected between the first power signal terminal PV1 and the gate electrode of the driving transistor Tm, as shown in FIG. 7; or any other capacitor of the pixel circuit. The second capacitor of the driving circuit can be the capacitor connected between the control terminal and the output terminal OUT of the output module 20, as shown in FIG. 8; or a capacitor connected to other functional modules in the driving circuit. In the actual application, according to specific design requirements, the pixel circuit can include the first capacitor, and the functional layers where the two plates of the first capacitor are located can be selected according to the requirements for the capacitance of the first capacitor in the circuit structure, and the connection relationship between the first capacitor and other circuit elements. At the same time, the driving circuit includes the second capacitor, and the functional layers where the two plates of the second capacitor are located can be selected according to the requirements for the capacitance of the second capacitor in the circuit structure, and the connection between the second capacitor and other circuit elements. In an embodiment, one plate of the first capacitor and one plate of the second capacitor are located in the same functional layer of the driving array layer. In another embodiment, one plate of the first capacitor and one plate of the second capacitor are located in the same functional layer of the driving array layer, and the other plate of the first capacitor and the other plate of the second capacitor are also located in the same functional layer of the driving array layer. In another embodiment, the four plates of the first capacitor and the second capacitor are located in four different functional layers. In the actual application, the functional layers where the plates of the capacitors are located can be flexibly selected according to the respective positions of the first capacitor and the second capacitor in the circuit structure.

In an embodiment, the pixel circuit includes a first transistor and a first capacitor, the driving circuit includes a second transistor and a second capacitor, an active layer of the first transistor contains silicon, and an active layer of the second transistor contains oxide semiconductor. The first transistor of the pixel circuit is a low-temperature polysilicon transistor, and the first transistor can be a driving transistor of the pixel circuit or a switching transistor of the circuit. In addition, when the first transistor of the pixel circuit is the switching transistor, the driving transistor can be an oxide transistor. The first capacitor of the pixel circuit can be a storage capacitor or other auxiliary capacitor. The second transistor of the driver circuit is an oxide transistor, and the second capacitor in the driver circuit can be a capacitor connected between the output terminal of the driver circuit and the control terminal of the output module. An orthographic projection of the first capacitor on a plane of the display panel at least partially overlaps an orthographic projection of the first transistor of the pixel circuit on the plane of the display panel; and an orthographic projection of the second capacitor on the plane of the display panel does not overlap an orthographic projection of the second transistor on the plane of the display panel. In this embodiment, since the first capacitor and the first transistor in the pixel circuit at least partially overlap, a size of the pixel circuit is reduced, and thus the spacing between adjacent pixel circuits is reduced. Thus, more pixel circuits can be arranged within a certain area of the driving array layer, thereby increasing a density of sub-pixels in the display panel and improving a display resolution. In addition, a light transmittance of the display panel can be improved, and an optical performance can be improved when it is used in a solution of under-screen optical element or transparent display panel. In addition, the size of the space occupied by the driving circuit arranged in a non-display area of the display panel will not affect the resolution of the display panel. The second capacitor and the second transistor do not overlap in the driving circuit, which can reduce a crosstalk between the components of the driving circuit, thereby ensuring the stability of the display performance of the display panel.

In another embodiment, the pixel circuit includes a first transistor and a first capacitor, the driving circuit includes a second transistor and a second capacitor, an active layer of the first transistor contains silicon, and an active layer of the second transistor contains oxide semiconductor. The first transistor of the pixel circuit is a low-temperature polysilicon transistor, and the first transistor can be a driving transistor of the pixel circuit or a switching transistor of the circuit. In addition, when the first transistor in the pixel circuit is the switching transistor, the driving transistor can be an oxide transistor. The first capacitor in the pixel circuit can be a storage capacitor or other auxiliary capacitor. The second transistor of the driver circuit is an oxide transistor, and the second capacitor of the driver circuit can be a capacitor connected between the output terminal of the driver circuit and the control terminal of the output module. An area of a region where an orthographic projection of the first capacitor on a plane of the display panel overlaps an orthographic projection of the first transistor of the pixel circuit on the plane of the display panel is greater than an area of a region where an orthographic projection of the second capacitor on the plane of the display panel overlaps an orthographic projection of the second transistor on the plane of the display panel. In this embodiment, a size of the pixel circuit is reduced, thereby increasing a density of sub-pixels of the display panel and also improving a display resolution. In addition, a light transmittance of the display panel can be improved, and an optical performance can be improved when it is used in a solution of under-screen optical element or transparent display panel. In addition, since the second capacitor overlaps the second transistor, the size of the space occupied by the driving circuit arranged in a non-display area can be reduced, which can reduce an area of the non-display area and increasing a screen-to-body ratio. In the present embodiment, as the capacitor and the transistor of the pixel circuit overlap as well as the capacitor and the transistor of the driving circuit overlap, the effects of improving the display resolution, avoiding crosstalk between the components of the driving circuit, and ensuring the stability of the display performance can be balanced, so as to enable an overall better performance of the display panel.

In some embodiments, the pixel circuit includes a first transistor and a third transistor, an active layer of the first transistor contains silicon, and an active layer of the third transistor contains oxide semiconductor; the driving circuit includes a second transistor and a fourth transistor, an active layer of the second transistor contains oxide semiconductor, and an active layer of the fourth transistor contains silicon. For example, in an embodiment, the first transistor of the pixel circuit is a driving transistor, and the third transistor is a switching transistor. In another embodiment, the first transistor of the pixel circuit is a switching transistor, and the third transistor is a driving transistor. In the driving circuit, the transistors can be the second transistor with an active layer containing oxide semiconductor, or the fourth transistor with an active layer containing silicon, according to requirements of the specific functional modules for transistor performances. In this embodiment, the channel region of the first transistor has a width of W1 and a length of L1; the channel region of the second transistor has a width of W2 and a length of L2; the channel region of the third transistor has a width of W3 and a length of L3; and the channel region of the fourth transistor has a width of W4 and a length of L4. In the driving array layer, the active layers of the first transistor and the fourth transistor both contain silicon, and the active layers of the second transistor and the third transistor both contain oxide semiconductor. The active layer of the first transistor and the active layer of the fourth transistor can be manufactured in one process, the active layer of the second transistor and the active layer of the third transistor can be manufactured in one process. In addition, the channel regions of the first transistor, the second transistor, the third transistor, and the fourth transistor have different sizes, such that the specific requirements of functional modules for transistor performances can be satisfied by providing transistors of different types in the pixel circuit and the driving circuit, thereby respectively improving the stability of the pixel circuit and the stability of the driving circuit.

In an embodiment, the pixel circuit includes a first transistor and a third transistor, an active layer of the first transistor contains silicon, and an active layer of the third transistor contains oxide semiconductor; the driving circuit includes a second transistor and a fourth transistor, an active layer of the second transistor contains oxide semiconductor, and an active layer of the fourth transistor contains silicon. Both the first transistor and the third transistor are switching transistors of the pixel circuit, where $|W1/L1-W4/L4|<|W2/L2-W3/L3|$. In the display panel, an absolute value of a difference between a width to length ratio of the first transistor of the pixel circuit and a width to length ratio the fourth transistor of the driving circuit is smaller than an absolute value of a difference between a width to length ratio of the third transistor of the pixel circuit and a width to length ratio of the second transistor of the driving circuit. In other words, in the pixel circuit and in the driving circuit, the difference between the width to length ratios of the silicon-based transistors is smaller than the difference between the width to length ratios of the oxide semiconductor-based transistors. In the display panel in the related art, the number of the silicon-based transistors is greater than the number of the oxide transistors, and thus the silicon-based transistors in the driving array layer occupy a larger area. If the difference between the width to length ratios of the silicon-based transistors in the pixel circuit and in the driving circuit is too great, an etching uniformity in the manufacturing process may be affected. Further, by satisfying $|W1/L1-W4/L4|<|W2/L2-W3/L3|$, the manufacturing process of the silicon-based transistors can be ensured. In the meantime, by setting the difference between the width to length ratios of the oxide transistors to be greater than the difference between the width to length ratios of the silicon-based transistors, the oxide transistors located at different positions and having functions can be adjusted in terms of the width to length ratios according to actual needs.

In an embodiment, the pixel circuit includes a first transistor and a third transistor, an active layer of the first transistor contains silicon, and an active layer of the third transistor contains oxide semiconductor; and the driving circuit includes a second transistor and a fourth transistor, an active layer of the second transistor contains oxide semiconductor, and an active layer of the fourth transistor contains silicon. Both the first transistor and the third transistor are driving transistors of the pixel circuit, and |W1/L1−W4/L4|>5*|W2/L2−W3/L3|. When the first transistor is the driving transistor, the first transistor in the pixel circuit requires a relatively great width to length ratio in order to intensify a driving performance, while the fourth transistor, as the switching transistor, does not require a relatively great width to length ratio, such that |W1/L1−W4/L4| is greater than |W2/L2−W3/L3|. Further, |W1/L1−W4/L4|>5*|W2/L2−W3/L3|, which means a width to length ratio of the driving transistor is generally five times or more than that of the switching transistor. By satisfying W1/L1−W4/L4|>5*|W2/L2−W3/L3|, the width to length ratio of the first transistor and the width to length ratios of other switching transistors can meet the respective requirements on their performances.

In an embodiment, the pixel circuit includes a first transistor and a third transistor, an active layer of the first transistor contains silicon, and an active layer of the third transistor contains oxide semiconductor; and the driving circuit includes a second transistor and a fourth transistor, an active layer of the second transistor contains oxide semiconductor, and an active layer of the fourth transistor contains silicon. The first transistor is a switching transistor of the pixel circuit, the third transistor is a driving transistor of the pixel circuit, and 5*|W1/L1−W4/L4|<|W2/L2−W3/L3|. When the first transistor is the switching transistor, a width to length ratio of the first transistor cannot be set too great to affect a switching capacity of the switching transistor. Based on the same principle mentioned above, the width to length ratio of the driving transistor is generally five times or more than that of the switching transistor, optimizing both the driving performance of the driving transistor and the switching capacity of the switching transistor. By satisfying 5*|W1/L1−W4/L4|<|W2/L2−W3/L3|, the width to length ratio of the first transistor and the width to length ratio of other switching transistors can be set to meet their respective performance requirements.

In some embodiments, the driving array layer is disposed on a base substrate, and the driving array layer includes a first metal layer, a second metal layer, a third metal layer and a fourth metal layer that are sequentially arranged along a direction facing away from the base substrate. That is, in the display panel provided by the present embodiment of the present disclosure, the driving array layer includes at least four metal layers, and the four metal layers are all functional layers configured to arrange electrodes or wires in circuit elements.

Figure 9:
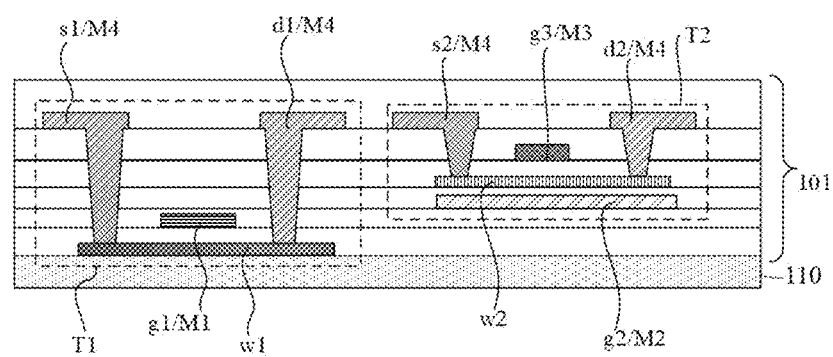
FIG. 9 is a schematic diagram of a display panel according to another embodiment of the present disclosure.

FIG. 9 is a schematic diagram of a display panel according to an embodiment of the present disclosure. In the embodiment shown in FIG. 9, the driving array layer includes a first metal layer M1, a second metal layer M2, a third metal layer M3 and a fourth metal layer M4 that are sequentially arranged along a direction facing away from the base substrate 110, and and the insulation layer is disposed between adjacent metal layers. The first transistor T1 includes a first gate electrode g1, a first source electrode s1, a first drain electrode d1 and a first active layer w1. The second transistor T2 includes a second gate electrode g2, a third gate electrode g3, a second source electrode s2, a second drain electrode d2 and a second active layer w2. The first gate electrode g1 is located in the first metal layer M1, the second gate electrode g2 is located in the second metal layer M2, the third gate electrode g3 is located in the third metal layer M3, and at least one of the first source electrode s1, the first drain electrode d1, the second source electrode s2 or the second drain electrode d2 is located in the fourth metal layer M4. The first active layer w1 is located close to the base substrate 110, and the second active layer w2 is located between the second gate electrode g2 and the third gate electrode g3. The first active layer w1 contains silicon, and the first transistor T1 is a top-gate transistor. On the one hand, the top-gate transistor can increase a distance between the gate electrode and a metal shielding film on the back of the display panel, and can effectively prevent a potential change at the gate electrode and a coupling-crosstalk with the metal shielding film of the display panel facing away from a light-emitting surface. On the other hand, during an active layer ion implantation process, the top-gate transistor is reused as a mask for differential ion implantation. The second active layer w2 includes oxide semiconductor. In the embodiment of the present disclosure, the gate electrode located at a side of the second active layer w2 close to the base substrate 110 (i.e., the second gate electrode g2, as illustrated) can be configured to prevent hydrogen in the insulation layer from affecting the second active layer w2, thereby guaranteeing the performance stability of the second transistor T2.

Figure 10:
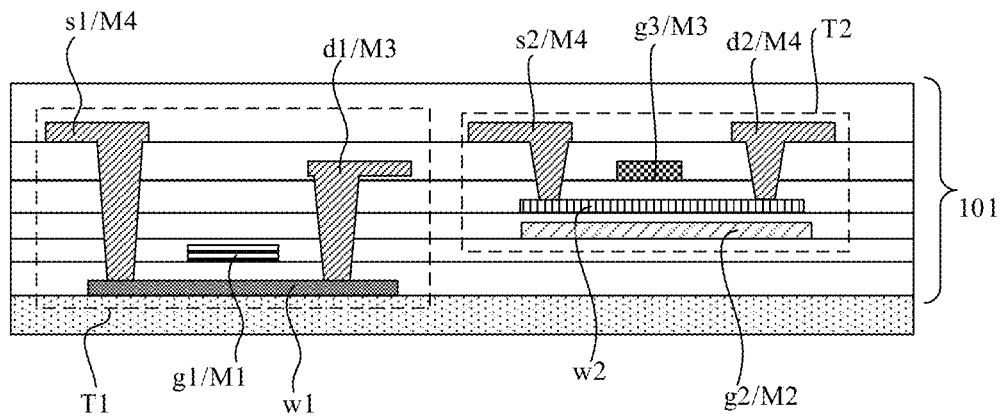
FIG. 10 is a schematic diagram of a display panel according to yet another embodiment of the present disclosure.

For example, FIG. 9 illustrates that the first source electrode s1, the first drain electrode d1, the second source electrode s2 and the second drain electrode d2 all located in the fourth metal layer M4. By forming the first source electrode s1, the first drain electrode d1, the second source electrode s2 and the second drain electrode d2 in the same metal layer, the number of the metal layers can be reduced, which can reduce the thickness of the display panel. FIG. 10 is a schematic diagram of a display panel according to another embodiment of the present disclosure. The embodiment shown in FIG. 10 differs from that shown in FIG. 9 in that, the first source electrode s1, the second source electrode s2 and the second drain electrode d2 are located in the fourth metal layer M4, and the first drain electrode d1 is located in the third metal layer M3. In the present embodiment, the first source electrode and the first drain electrode of the first transistor T1 are located in different metal layers, and the metal layers where the source electrode and the drain electrode of the first transistor are located can be selected according to the connection between the source electrode and the drain electrode of the first transistor and other elements of the circuit, so as to realize proper wirings and reduce windings or vias. In another embodiment, in accordance with the design requirements on circuit, the second source electrode and the second drain electrode of the second transistor can be located in different metal layers, which is not specifically illustrated in the drawings.

In an embodiment, on the basis of the embodiment shown in FIG. 9, the first plate is located in the first metal layer, and the second plate is located in the second metal layer. The first plate located in the first metal layer and the second plate located in the second metal layer constitute the first capacitor. The requirements for the capacitance of the first capacitor can be satisfied by selecting a material and a thickness of the insulation layer located between the first metal layer and the second metal layer. One insulation layer or two or three insulation layers can be sandwiched between the first metal layer and the second metal layer. In an embodiment, the requirements for the capacitance of the first capacitor can be satisfied by adjusting a dielectric constant of the material of the insulation layer.

Figure 11:
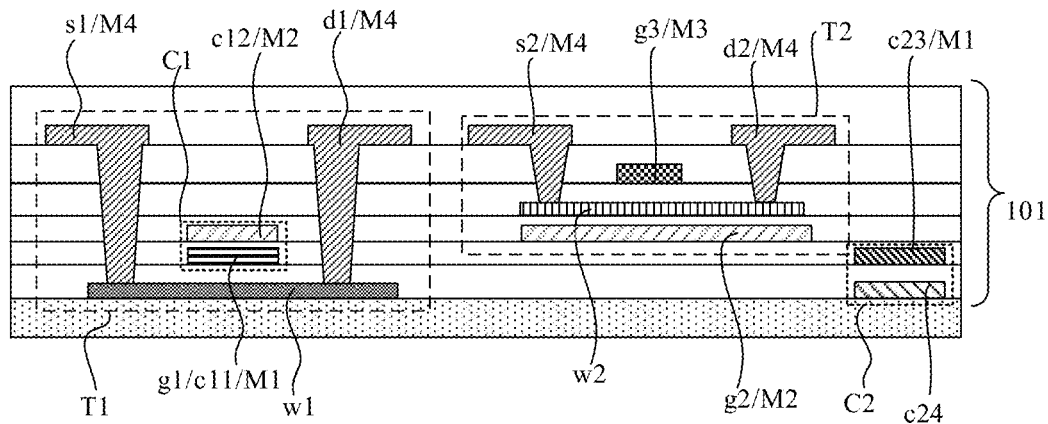
FIG. 11 is a schematic diagram of a display panel according to yet another embodiment of the present disclosure.

In an embodiment, the driving array layer includes the pixel circuit, the first transistor is a driving transistor of the pixel circuit, i.e., the active layer of the driving transistor includes silicon; and the pixel circuit includes the first capacitor connected between the first power signal terminal and the gate electrode of the driving transistor and configured to store the signal transmitted to the gate electrode of the driving transistor. The connection between the first capacitor in the pixel circuit and other components can refer to the embodiment shown in FIG. 7. The first capacitor C1 is connected between the first power signal terminal PV1 and the gate electrode of the driving transistor Tm. That is, the first capacitor C1 is connected between the first power signal terminal PV1 and the gate electrode of the first transistor in the present disclosure. FIG. 11 is a schematic diagram of a display panel according to another embodiment of the present disclosure. With reference to FIG. 1, the first plate c11 is located in the first metal layer M1, and the second plate c12 is located in the second metal layer M2. The first gate electrode g1 of the first transistor T1 is reused as the first plate c11, and an orthographic projection of the first capacitor C1 on the plane of the display panel partially overlaps an orthographic projection of the first transistor T1 on the plane of the display panel. In this embodiment, the first transistor is a driving transistor, and the first capacitor is a storage capacitor in the pixel circuit. One plate of the first capacitor is connected to the gate electrode of the driving transistor, i.e., one plate of the first capacitor is connected to the first gate electrode of the first transistor, and the first gate electrode of the first transistor is reused as the first plate of the first capacitor. In this way, the number of connection lines between the first plate and the first gate electrode can be reduced, thereby simplifying the wirings in the display panel. Meanwhile, the first capacitor and the first transistor at least partially overlap, and thus the size of one pixel circuit can be reduced, which reduces the distance between adjacent pixel circuits to allow more pixel circuits to be arranged in a certain region of the driving array layer, thereby increasing the density of sub-pixels in the display panel and improving the display resolution. In addition, the light transmittance of the display panel can be enhanced, and an optical performance can be improved when it is used in a solution of under-screen optical element or transparent display panel.

Figure 12:
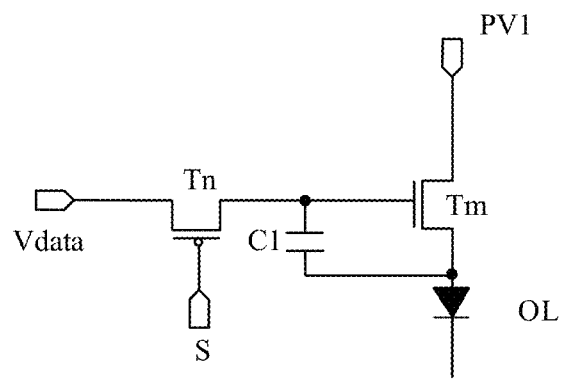
FIG. 12 is a schematic diagram of a pixel circuit of a display panel according to another embodiment of the present disclosure.
Figure 13:
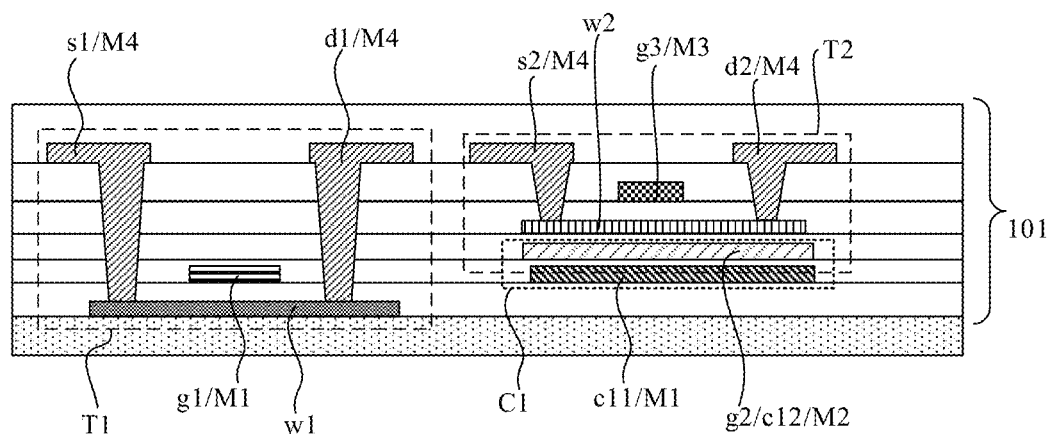
FIG. 13 is a schematic diagram of a layer structure of the display panel shown in the embodiment shown in FIG. 12 according to an embodiment.

In another embodiment, the driving array layer includes the pixel circuit, the second transistor is a driving transistor of the pixel circuit, i.e., the active layer of the driving transistor includes silicon; the pixel circuit includes the first capacitor configured to store the signal transmitted to the gate electrode of the driving transistor. FIG. 12 is a schematic diagram of a pixel circuit in a display panel according to another embodiment of the present disclosure, and FIG. 13 is a schematic diagram of a layer structure of the display panel according to the embodiment shown in FIG. 12. As shown in FIG. 12, the pixel circuit includes a driving transistor Tm and a switching transistor Tn, the pixel circuit is electrically connected to the light-emitting element OL. Additionally, a first power signal terminal PV1, a data signal terminal Vdata and a scanning control terminal S are illustrated. One plate of the first capacitor C1 is connected to the gate electrode of the driving transistor Tm, and the other plate thereof is connected to the light-emitting element OL. As shown in FIG. 13, the first plate c11 is located in the first metal layer M1, and the second plate c12 is located in the second metal layer M2. The second gate electrode g2 is reused as the second plate c12, and an orthographic projection of the first capacitor C1 on the plane of the display panel partially overlaps an orthographic projection of the second transistor T2 on the plane of the display panel. In this embodiment, the second transistor T2 is a driving transistor, i.e., the active layer of the driving transistor contains oxide semiconductor. The driving transistor containing oxide semiconductor is an N-type transistor. FIG. 12 also illustrates that the switching transistor Tn is a P-type transistor. The first capacitor C1 is a storage capacitor in the pixel circuit. One plate of the first capacitor C1 is connected to the gate electrode of the driving transistor (i.e., the second transistor T2). In this embodiment, the second transistor T2 includes the second gate electrode g2 and third gate electrode g3, the second gate electrode g2 of the second transistor is reused as the second plate c12 of the first capacitor C1. In this way, the number of connection lines between the second plate and the gate electrode of the second transistor T2 can be reduced, thereby simplifying the wirings in the display panel. Meanwhile, the first capacitor and the second transistor at least partially overlap, and thus the size of one pixel circuit can be reduced and the distance between adjacent the pixel circuits can be reduced to allow more pixel circuits to be arranged in a certain region of the driving array layer, thereby increasing the density of sub-pixels of the display panel and improving the display resolution. In addition, the light transmittance of the display panel can be enhanced, and an optical performance can be improved when it is used in a solution of under-screen optical element or transparent display panel.

In the embodiment of the present disclosure, the first plate of the first capacitor is located in the first metal layer, and the second plate of the first capacitor is located in the second metal layer. The third plate and the fourth plate are respectively located in any two of the first metal layer, the second metal layer, the third metal layer, the fourth metal layer, the first active layer or the second active layer. The third plate is located in a layer where one of the first metal layer, the second metal layer and the first active layer is located. The fourth plate is located in a layer where one of the third metal layer, the fourth metal layer and the second active layer is located. In the present disclosure, depending upon the individual positions of the first capacitor and the second capacitor in the circuit structure, the plates of the capacitors can be flexibly provided in the functional layers, and thus the two plates of the first capacitor and the two plates of the second capacitor can be arranged in the functional layers with higher degree of freedom.

In an embodiment, as illustrated in FIG. 11, the first plate c11 of the first capacitor C1 is located in the first metal layer M1, and the second plate c12 of the first capacitor C1 is located in the second metal layer M2. The third plate c23 of the second capacitor C2 is located in the first metal layer M1, and the fourth plate c24 of the second capacitor C2 is located in the first active layer. That is, the fourth plate c24 and the first active layer of the first transistor T1 are located in the same layer. In the present embodiment, the first plate and the third plate are located in the same functional layer, and the second plate and the fourth plate are located in different functional layers.

In an embodiment, in which the first plate of the first capacitor and the third plate of the second capacitor are located in the same functional layer and the second plate of the first capacitor and the fourth plate of the second capacitor are located in different functional layers, the first plate and the third plate are located in the first metal layer, the second plate is located in the second metal layer, and the fourth plate is located in the fourth metal layer or in the second active layer.

In another embodiment, the first plate is located in the first metal layer, the second plate is located in the second metal layer, the third plate is located in the first metal layer, and the fourth plate is located in the second metal layer. That is, one plate of the first capacitor and one plate of the second capacitor are located in the same functional layer, and the other plate of the first capacitor and the other plate of the second capacitor are located in the same functional layer.

In some embodiments, the first plate is located in the first metal layer, the second plate is located in the second metal layer, and the third plate and the fourth plate are respectively located in any two of the third metal layer, the fourth metal layer, the first active layer or the second active layer. In other embodiments, the third plate is located in the third metal layer, and the fourth plate is located in the fourth metal layer; or, the third plate is located in the fourth metal layer, and the fourth plate is located in the first active layer; or, the third plate is located in the first active layer, and the fourth plate is located in the second active layer.

For example, the first plate is located in the first metal layer, the second plate is located in the second metal layer, the third plate is located in a layer where one of the first metal layer, the second metal layer and the first active layer is located; and the fourth plate is located in a layer where one of the third metal layer, the fourth metal layer and the second active layer is located.

Figure 14:
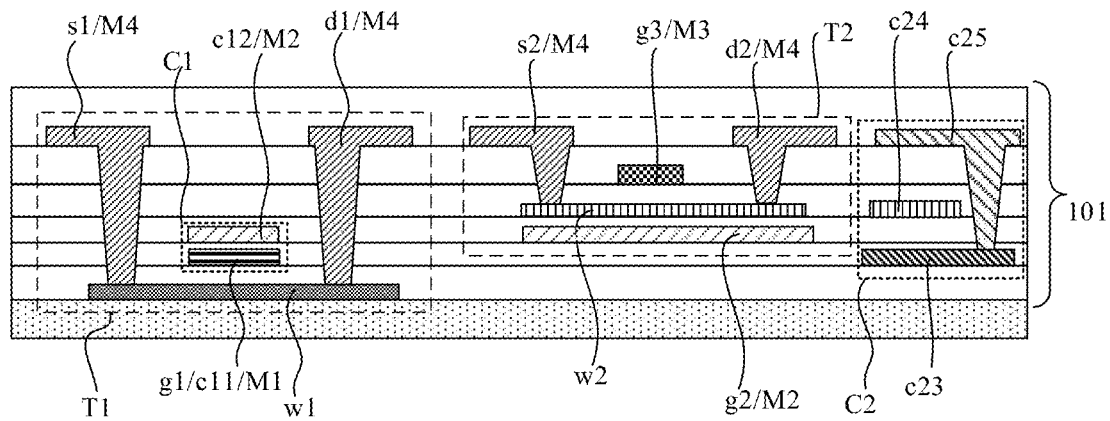
FIG. 14 is a schematic diagram of a layer structure of a display panel according to another embodiment of the present disclosure.

In an embodiment, the second capacitor further includes a fifth plate connected to the third plate or the fourth plate and located on a side of the fourth plate facing away from the third plate. FIG. 14 is a schematic diagram of a layer structure of a display panel according to another embodiment of the present disclosure. As shown in FIG. 14, the second capacitor C2 further includes a fifth plate c25 connected to the third plate c23 and located on a side of the fourth plate c24 facing away from the third plate c23. By providing the fifth plate and connecting the fifth plate to the third plate, the capacitance of the second capacitor can be increased, thereby reducing the space occupied by the second capacitor in the driving array layer, and reducing the overall space occupied by pixel circuits, conducive to increasing the density of sub-pixels in the display panel and improving the display resolution. FIG. 14 only shows that the second capacitor includes three plates, the third plate c23 is located in the same layer as the first gate electrode g1 of the first transistor T1, and the fourth plate c24 is located in the same layer as the second active layer w2 of the second transistor T2, and the fifth plate c25 is located in the same layer as the second source electrode s2 and second drain electrode d2 of the second transistor T2. FIG. 14 merely illustrates one arrangement of the three plates of the second capacitor. In practical applications, the three plates of the second capacitor can be arranged in any three layers of the first metal layer, the second metal layer, the third metal layer, the fourth metal layer, the first active layer, or the second active layer, according to specific design requirements.

In an embodiment, the driving array layer includes the pixel circuit, the first transistor is a driving transistor of the pixel circuit, and the second transistor is a threshold compensation transistor of the pixel circuit. The driving transistor has a control terminal electrically connected a first node, a first terminal electrically connected to a second node, a second terminal electrically connected to a third node. The threshold compensation transistor has a first terminal electrically connected to the third node, and a second terminal electrically connected to the first node, and a control terminal electrically connected to the first scanning signal terminal. The pixel circuit includes a first capacitor and a second capacitor. The first capacitor is connected between a first power signal terminal and a gate electrode of the driving transistor, and is configured to store signal transmitted to the gate electrode of the driving transistor. In this embodiment, an active layer of the driving transistor includes silicon, and an active layer of the threshold compensation transistor includes oxide semiconductor. Then the threshold compensation transistor has a small leakage current in an off state, which can reduce the impact of the leakage current on the potential at the gate electrode of the driving transistor in the off state, thereby stabilizing the voltage at the gate electrode of the driving transistor and improving an operation stability of the driving transistor. When the pixel circuit is applied into the display panel, it is guaranteed that the light emitted by the light-emitting elements has uniform brightness.

Hereinafter, an example of the pixel circuit including the first capacitor and the second capacitor will be described in detail.

Figure 15:
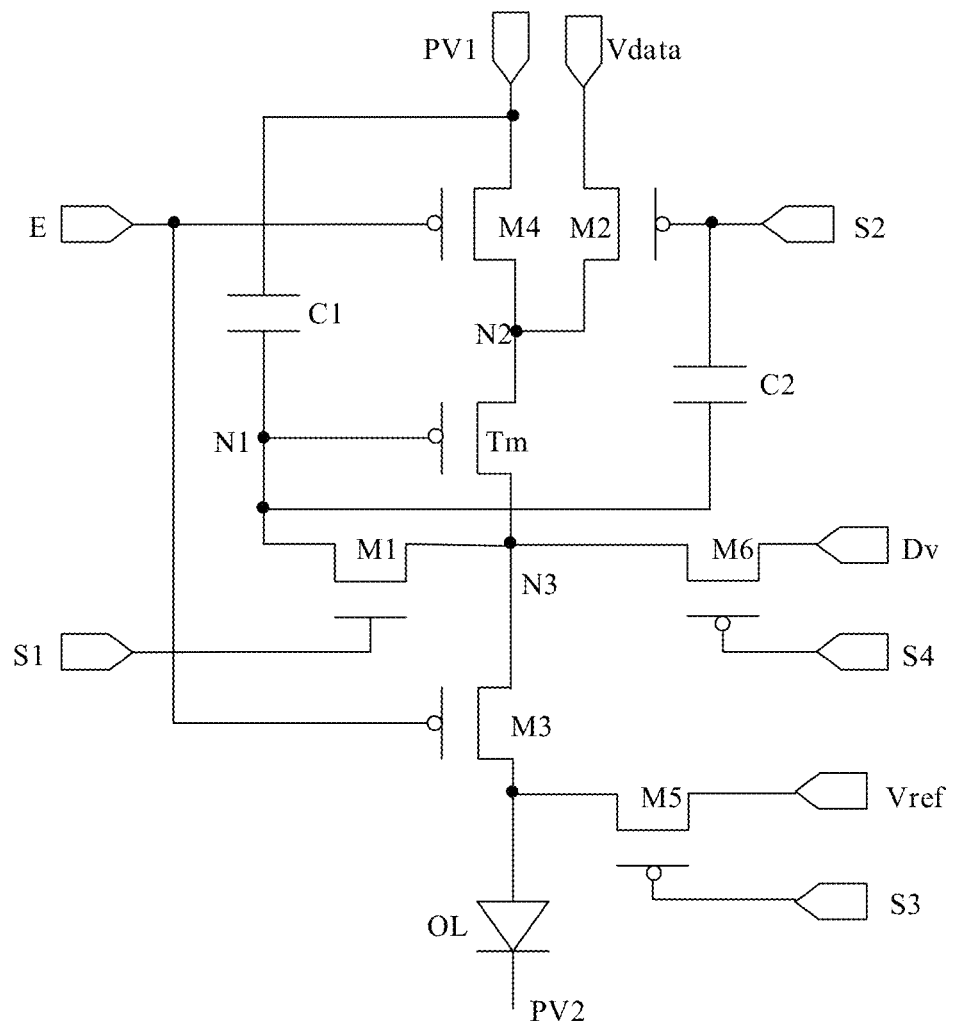
FIG. 15 is a schematic diagram of a pixel circuit in a display panel according to another embodiment of the present disclosure.
Figure 16:
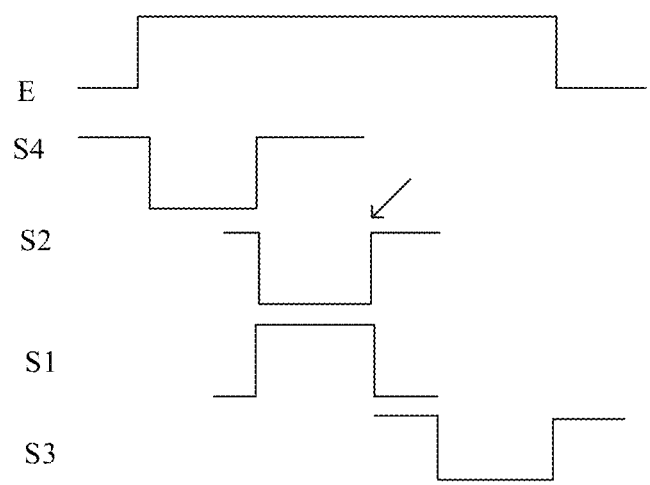
FIG. 16 is a sequence diagram of the pixel circuit in the display panel according to the embodiment shown in FIG. 15.
Figure 17:
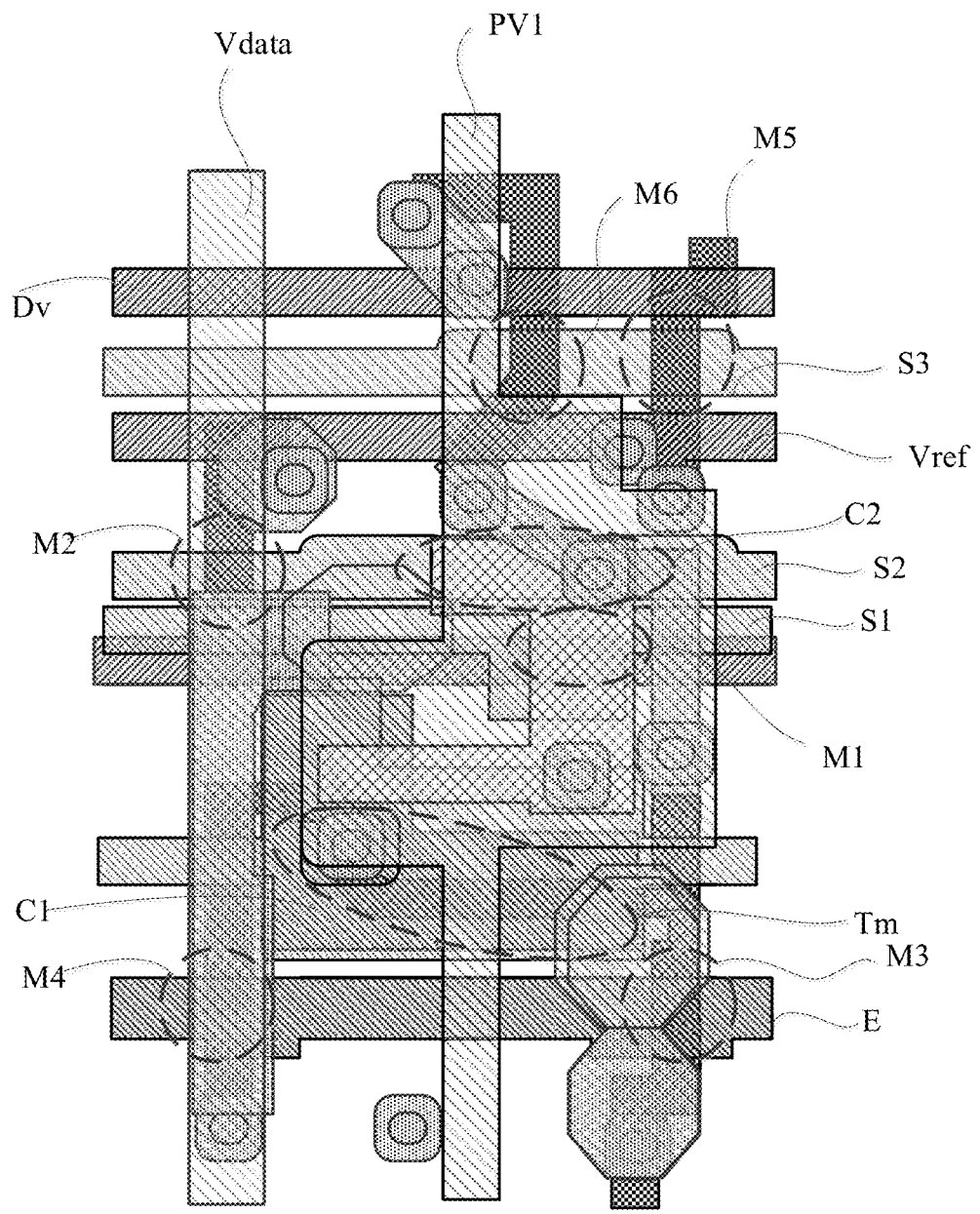
FIG. 17 is a wiring diagram of the pixel circuit in the display panel according to the embodiment shown in FIG. 15.
Figure 18:
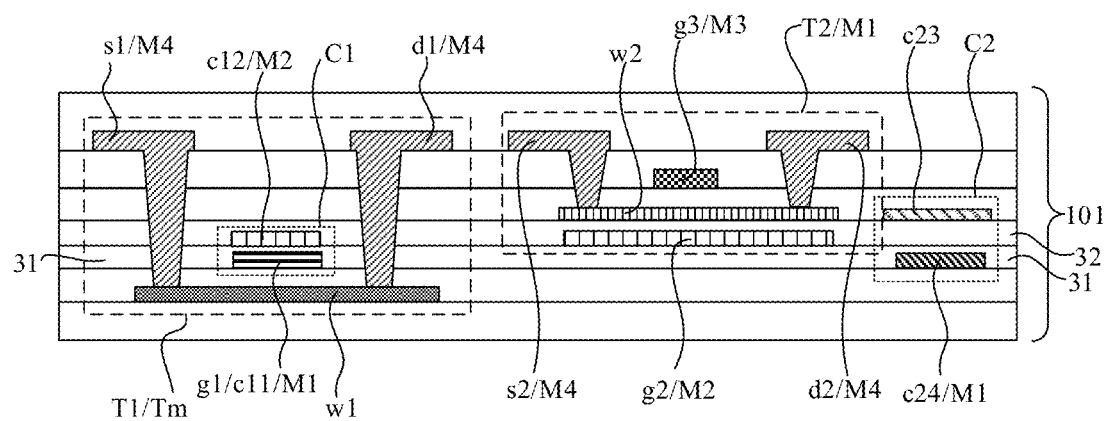
FIG. 18 is a schematic diagram of a layer structure of the display panel according to the embodiment shown in FIG. 17.

FIG. 15 is a schematic diagram of another alternative pixel circuit of the display panel according to another embodiment of the present disclosure. FIG. 16 is a timing diagram of the pixel circuit of the display panel according to the embodiment shown in FIG. 15. FIG. 17 is a wiring diagram of the pixel circuit of the display panel according to the embodiment shown in FIG. 15. FIG. 18 is a schematic diagram of a layer structure of the display panel shown in FIG. 17 according to the embodiment.

As shown in FIG. 15 and FIG. 17, the first transistor T1 is a driving transistor of the pixel circuit Tm, and the second transistor T2 is a threshold compensation transistor M1 of the pixel circuit. The gate electrode of the driving transistor Tm and the first node N1 is electrically connected, the second terminal of the driving transistor Tm is electrically connected to the second node N2, the second terminal of the driving transistor Tm is electrically connected to the third node N3. The first terminal of the threshold compensation transistor M1 is electrically connected to the third node N3, and the second terminal of the compensation transistor M1 is electrically connected to the first node N1, and the gate electrode of the threshold compensation transistor M1 is electrically connected to the first scanning signal terminal S1. The pixel circuit includes a data writing transistor M2, a second scanning signal terminal S2 and a data signal terminal Vdata. The data writing transistor M2 has a gate electrode electrically connected to the second scanning signal terminal S2, and a first terminal electrically connected to the data signal terminal Vdata, and a second terminal electrically connected to the second node N2. The pixel circuit further includes a second capacitor C2 having a third plate c23 connected to the gate electrode of the driving transistor Tm and a fourth plate c24 connected to the second scanning signal terminal S2. The second capacitor C2 is configured to latch a potential at the gate electrode of the driving transistor Tm.

The pixel circuit further includes a first light-emission control transistor M3, a second light-emission control transistor M4, a reset transistor M5, and a bias adjustment transistor M6. A gate electrode of the first light-emission control transistor M3 and a gate electrode of the second light-emission control transistor M4 are both electrically connected to the light-emission control terminal E. A first terminal of the first light-emission control transistor M3 is electrically connected to the third node N3. A second terminal of the first light-emission control transistor M3 is electrically connected to an anode of the light-emitting element OL. A first terminal of the second light-emission control transistor M4 is electrically connected to the first power signal terminal PV1. A second terminal of the second light-emission control transistor M4 is electrically connected to the second node N2. The reset transistor M5 has a gate electrode electrically connected to the third scanning signal terminal S3, a first terminal electrically connected to the reset signal terminal Vref, and a second terminal electrically connected to the anode of the light-emitting element OL. A cathode of the light-emitting element OL is electrically connected to the second power signal terminal PV2. The bias adjustment transistor M6 has a gate electrode electrically connected to the fourth scanning signal terminal S4, a first terminal electrically connected to the bias signal terminal DV, and a second terminal electrically connected to the third node N3. The bias adjustment transistor M6 is configured to adjust a bias state of the driving transistor Tm. When the pixel circuit operates in a light-emitting phase, a potential at the first node N1 is higher than a potential at the third node N3, and thus the driving transistor Tm produces a hysteresis effect, resulting in a shifting of an Id-Vg curve (a curve indicating a relationship between current of the drain electrode of the transistor and voltage of the gate electrode of the transistor), and further resulting in a threshold voltage shift of the driving transistor. The third scanning signal terminal S3 and the fourth scanning signal terminal S4 can be provided with signals by two adjacent shift registers in one driving circuit. FIG. 17 only shows the third scanning signal terminal S3.

Referring to the timing diagram of FIG. 16, due to providing the second capacitor C2, when a signal jumping direction of the first scanning signal terminal S1 is opposite to a signal jumping direction of the second scanning signal terminal S2, a signal jumping of the second scanning signal terminal S2 can offset the influence of a signal jumping of the first scanning signal terminal S1 on the first node N1, to a certain extent. In this embodiment, the second capacitor C2 can pull up the potential at the first node N1 at the moment when the signal of the second scanning signal terminal S2 is a rising edge, so as to stabilize the potential at the first node N1.

As shown in FIG. 18, in this embodiment, the gate electrode of the driving transistor Tm (i.e., the first gate electrode g1 of the first transistor T1) is reused as the first plate c11 of the first capacitor C1. The gate electrode of the driving transistor Tm is located in the first metal layer M1, and the second plate c12 of the first capacitor C1 is located in the second metal layer M2. The threshold compensation transistor M1 is the second transistor T2. The second gate electrode g2 of the second transistor T2 is located in the second metal layer, and the third gate electrode g3 of the second transistor is located in the third metal layer M3. The first source electrode s1 and the first drain electrode d1 of the first transistor T1, as well as the second source electrode s2 and the second drain electrode d2 of the second transistor T2 are all located in the fourth metal layer M4. The third plate c23 is connected to the gate electrode of the driving transistor Tm, and the fourth plate c24 is connected to the second scanning signal terminal S2. The third plate c23 of the second capacitor C2 is located in the same layer as the active layer of the threshold compensation transistor M1 (i.e., the second active layer w2 of the second transistor T2), and the fourth plate c24 of the second capacitor C2 is located in the same layer as the gate electrode of the driving transistor Tm. In this embodiment, the layers where the plates of the two capacitors are located can be selected according to the connection relationship of the two capacitors in the pixel circuit with other transistor devices, thereby simplifying the wirings of the pixel circuit in the display panel and saving space.

In an embodiment shown in FIG. 15, the threshold compensation transistor M1 is a P-type transistor, and the driving transistor and other switching transistors in the pixel circuit are all N-type transistors.

Figure 19:
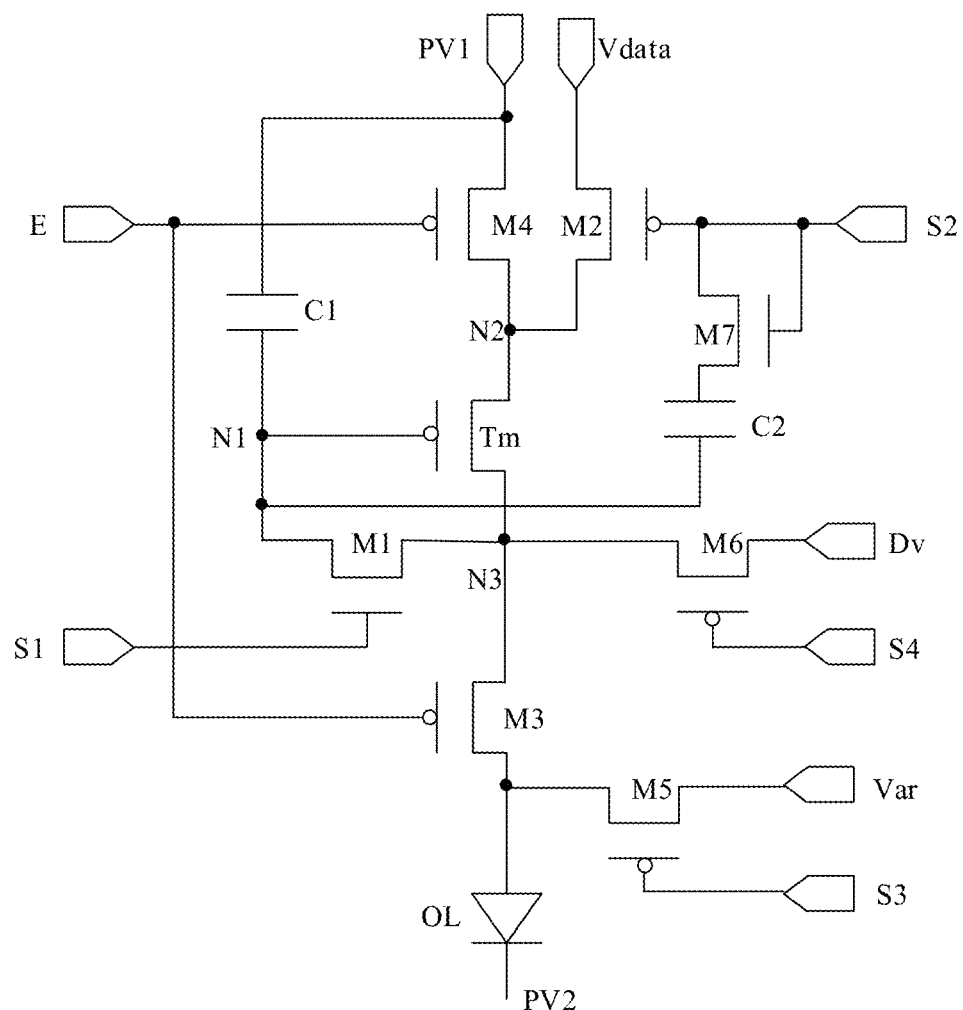
FIG. 19 is a schematic diagram of a display panel according to yet another embodiment of the present disclosure.

FIG. 19 is a schematic diagram of a display panel according to yet another embodiment of the present disclosure. In view of FIG. 15, the pixel circuit further includes a first auxiliary transistor. As shown in FIG. 19, the first auxiliary transistor M7 has a gate electrode and a first terminal that are both electrically connected to the second scanning signal terminal S2, and a second terminal connected to one plate of the second capacitor C2. The third plate c23 of the second capacitor C2 is connected to the gate electrode of the driving transistor Tm, and the fourth plate c24 of the second capacitor C2 is electrically connected to the second terminal of the first auxiliary transistor M7. The first auxiliary transistor M7 is a p-type transistor. In an embodiment, the active layer of the first auxiliary transistor M7 includes oxide semiconductor. In this embodiment, by additionally providing the first auxiliary transistor between the second capacitor and the second scanning signal terminal S2 and controlling the first auxiliary transistor by the second scanning signal terminal S2, it is ensured that the first auxiliary transistor M7 is switched on to maintain the potential at the first node N1 only when the signal of the second scanning signal terminal S2 is a rising edge.

Figure 20:
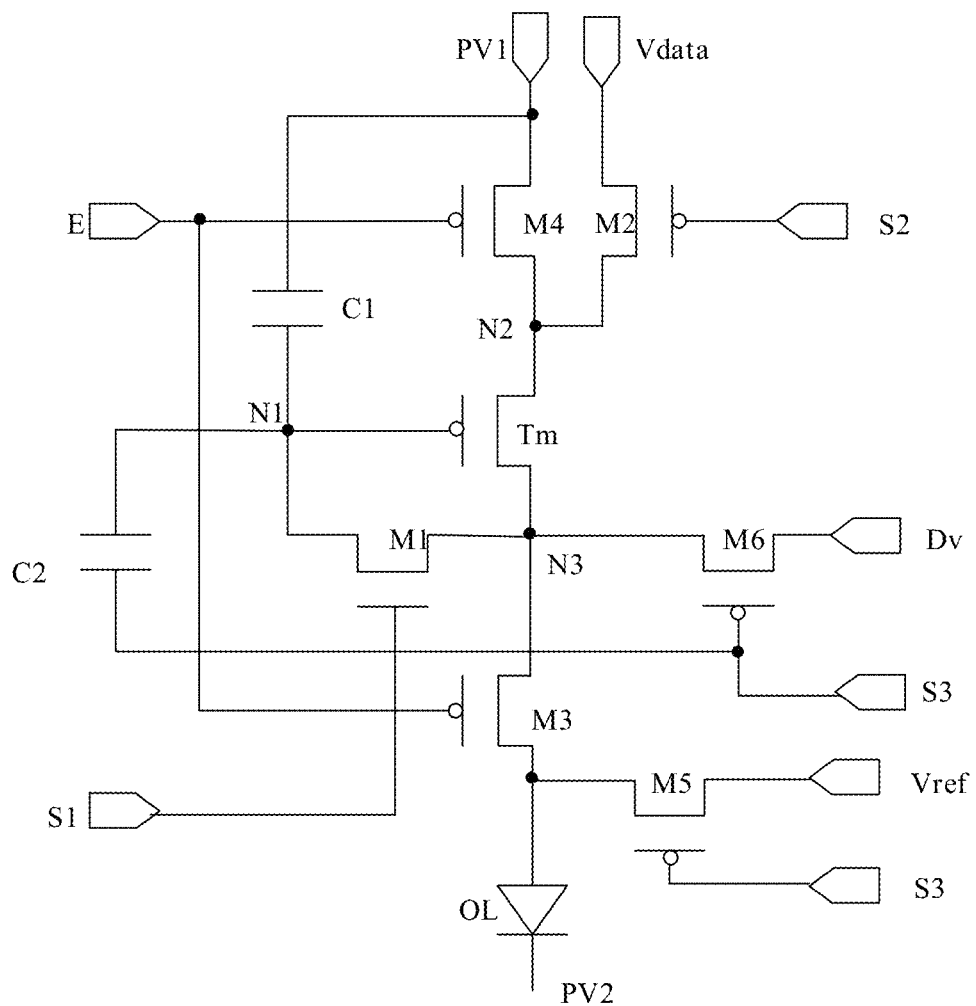
FIG. 20 is a schematic diagram of a pixel circuit of a display panel according to yet another embodiment of the present disclosure.
Figure 21:
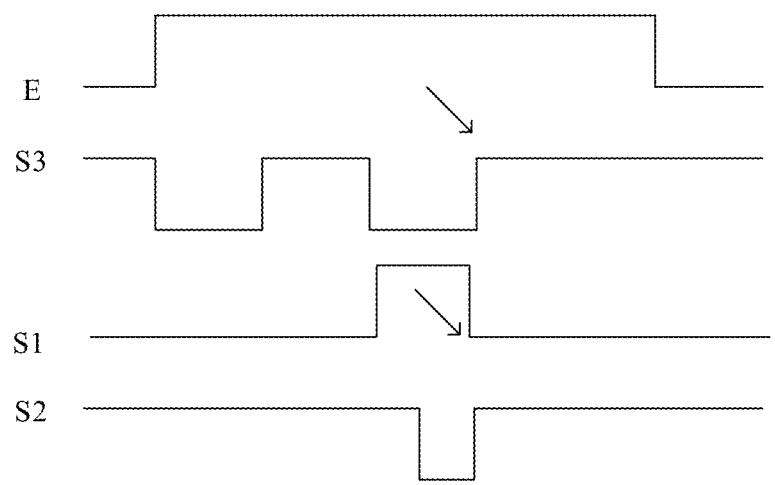
FIG. 21 is a timing diagram of a pixel circuit shown in FIG. 20 according to an embodiment.

FIG. 20 is a schematic diagram of a pixel circuit in a display panel according to yet another embodiment of the present disclosure, and FIG. 21 is a sequence diagram of the pixel circuit shown in FIG. 20 according to an embodiment.

As shown in FIG. 20, the first transistor T1 is a driving transistor of the pixel circuit Tm, and the second transistor T2 is a threshold compensation transistor M1 of the pixel circuit. The driving transistor Tm has a gate electrode electrically connected to the first node N1, a first terminal electrically connected to the second node N2, and a second terminal electrically connected to the third node N3. The threshold compensation transistor M1 has a first terminal electrically connected to the third node N3, a second terminal electrically connected to the first node N1, and a gate electrode electrically connected to the first scanning signal terminal S1. The pixel circuit includes a data writing transistor M2, a second scanning signal terminal S2 and a data signal terminal Vdata. The data writing transistor M2 has a gate electrode electrically connected to the second scanning signal terminal S2, a first terminal electrically connected to the data signal terminal Vdata, and a second terminal electrically connected to the second node N2.

The pixel circuit can further include a first light-emission control transistor M3, a second light-emission control transistor M4, a reset transistor M5, and a bias adjustment transistor M6. A gate electrode of the first light-emission control transistor M3 and a gate electrode of the second light-emission control transistor M4 are both electrically connected to the light-emission control terminal E. A first terminal of the first light-emission control transistor M3 is electrically connected to the third node N3. A second terminal of the first light-emission control transistor M3 is electrically connected to an anode of the light-emitting element OL. A first terminal of the second light-emission control transistor M4 is electrically connected to the first power signal terminal PV1. A second terminal of the second light-emission control transistor M4 is electrically connected to the second node N2. The reset transistor M5 has a gate electrode electrically connected to the third scanning signal terminal S3, a first terminal electrically connected to the reset signal terminal Vref, and a second terminal electrically connected to the anode of the light-emitting element OL. A cathode of the light-emitting element OL is electrically connected to the second power signal terminal PV2. The bias adjustment transistor M6 has a gate electrode electrically connected to the third scanning signal terminal S3, a first terminal electrically connected to the bias signal terminal DV, and a second terminal electrically connected to the third node N3. The bias adjustment transistor M6 is configured to adjust a bias state of the driving transistor Tm. When the pixel circuit operates in a light-emitting phase, a potential at the first node N1 is higher than a potential at the third node N3, and thus the driving transistor Tm produces a hysteresis effect, resulting in a threshold voltage shift. In this embodiment, the bias adjustment transistor M6 can achieve a reverse bias of the driving transistor, thereby compensating the threshold voltage shift caused by the hysteresis effect of the driving transistor.

In the embodiment shown in FIG. 20, the threshold compensation transistor M1 is a P-type transistor, and the driving transistor and other switching transistors in the pixel circuit are all N-type transistors. The pixel circuit includes a second capacitor C2 having a third plate connected to the gate electrode of the driving transistor Tm and a fourth plate connected to the third scanning signal terminal S3. The second capacitor C2 is configured to maintain the potential at the gate electrode of the driving transistor. Referring to FIG. 21, when the signal of the third scanning signal terminal S3 is a rising edge, the second capacitor C2 can pull up the potential at the first node N1, so as to stabilize the potential at the first node N1.

In the embodiment shown in FIG. 20, the gate electrode of the bias adjustment transistor M6 and the gate electrode of the reset transistor M5 are both connected to the third scanning signal terminal S3, that is, the light-emitting element OL is reset while the driving transistor Tm is biased. In another embodiment, the gate electrode of the bias adjustment transistor M6 and the gate electrode of the reset transistor M5 are connected to different signal terminals, so that the bias adjustment of the driving transistor Tm and the reset of the light-emitting element OL can be performed at different moments.

Figure 22:
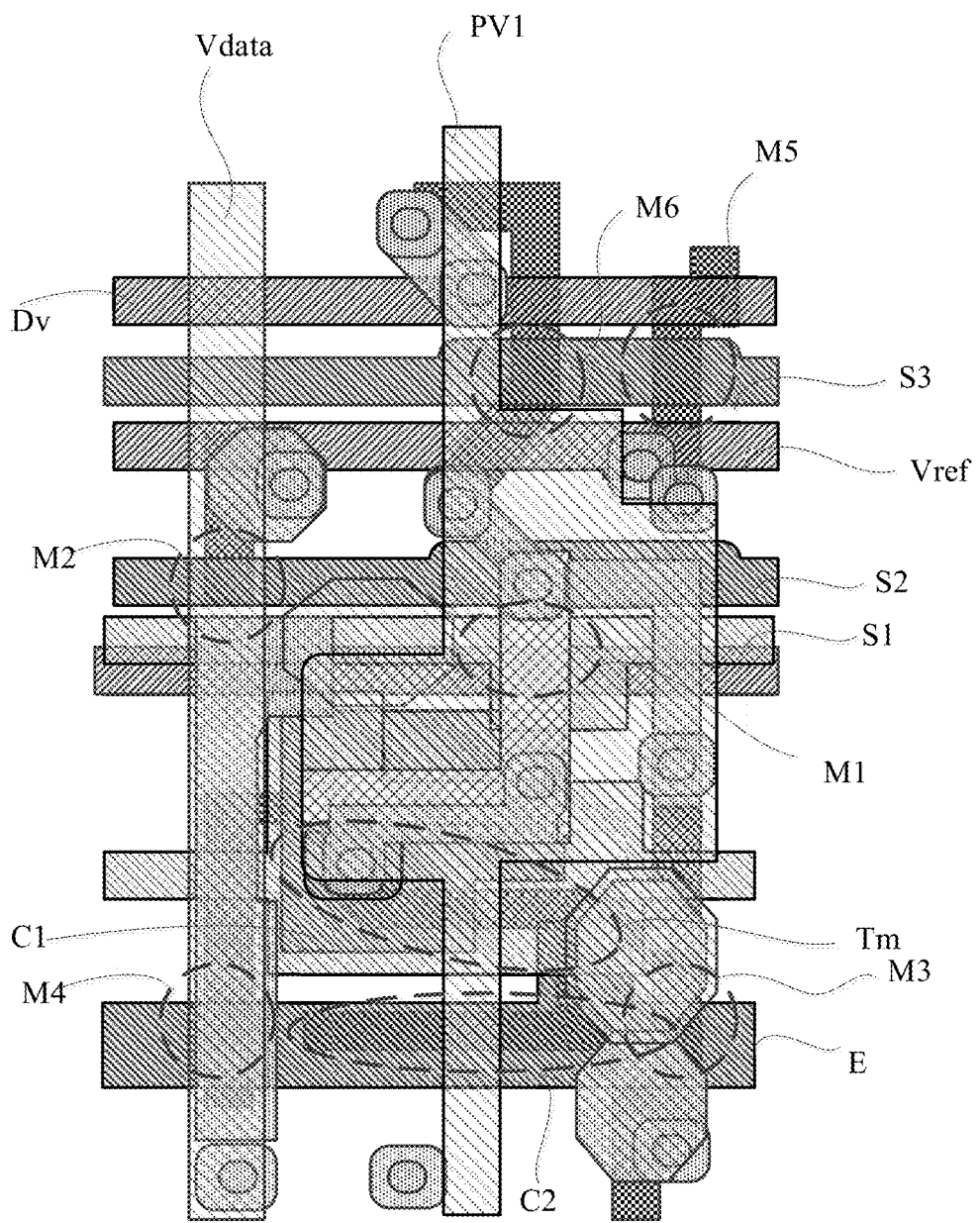
FIG. 22 is a wiring diagram of a pixel circuit of a display panel according to yet another embodiment of the present disclosure.

In another embodiment, the pixel circuit of the display panel can refer to FIG. 7. FIG. 22 is a wiring diagram of a pixel circuit of a display panel according to yet another embodiment of the present disclosure, FIG. 23 is a timing diagram of the pixel circuit shown in FIG. 7 according to the embodiment, and FIG. 24 is a schematic diagram of a layer structure of the display panel shown in FIG. 22 according to the embodiment.

Figure 23:
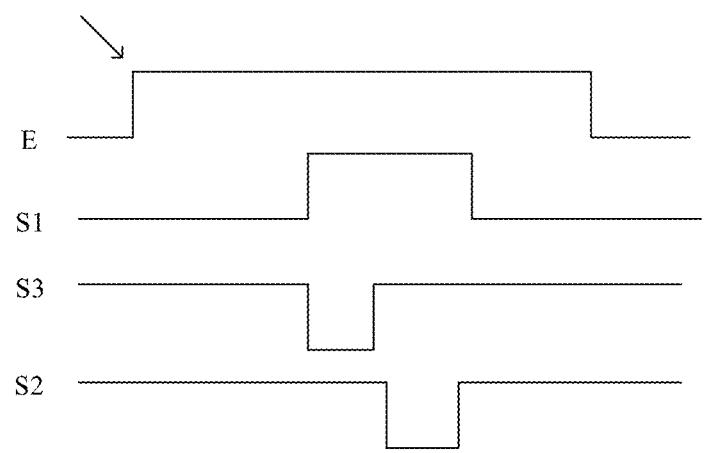
FIG. 23 is a sequence diagram of a pixel circuit shown in FIG. 7 according to an embodiment.
Figure 24:
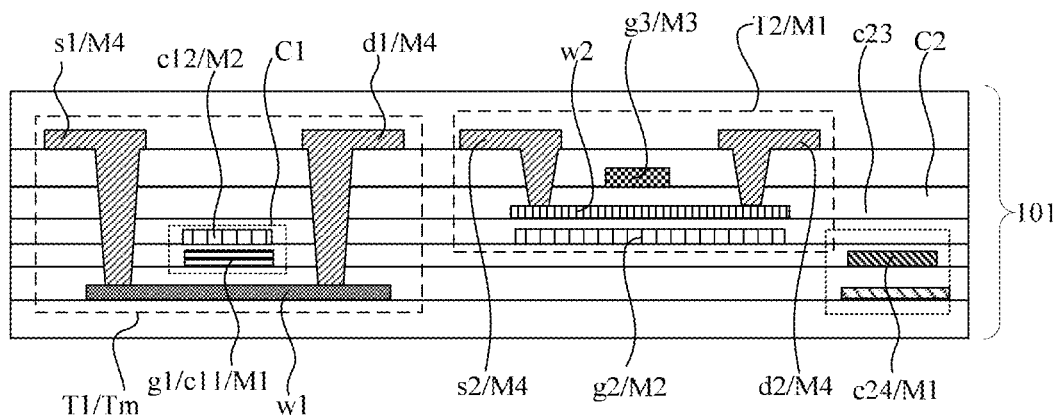
FIG. 24 is a schematic diagram of a layer structure of a display panel shown in FIG. 22 according to an embodiment.

Referring to FIG. 7 and FIG. 23, the first transistor T1 is a driving transistor of the pixel circuit Tm, and the second transistor T2 is a threshold compensation transistor M1 of the pixel circuit. The driving transistor Tm has a gate electrode electrically connected to the first node N1, a first terminal electrically connected to the second node N2, and a second terminal electrically connected to the third node N3. The threshold compensation transistor M1 has a first terminal electrically connected to the third node N3, a second terminal electrically connected to the first node N1, and a gate electrode electrically connected to the first scanning signal terminal S1. The pixel circuit includes a data writing transistor M2, a second scanning signal terminal S2 and a data signal terminal Vdata. The data writing transistor M2 has a gate electrode electrically connected to the second scanning signal terminal S2, a first terminal electrically connected to the data signal terminal Vdata, and a second terminal electrically connected to the second node N2.

The pixel circuit further includes a first light-emission control transistor M3, a second light-emission control transistor M4, a reset transistor M5, and a bias adjustment transistor M6. A gate electrode of the first light-emission control transistor M3 and a gate electrode of the second light-emission control transistor M4 are both electrically connected to the light-emission control terminal E. A first terminal of the first light-emission control transistor M3 is electrically connected to the third node N3. A second terminal of the first light-emission control transistor M3 is electrically connected to an anode of the light-emitting element OL. A first terminal of the second light-emission control transistor M4 is electrically connected to the first power signal terminal PV1. A second terminal of the second light-emission control transistor M4 is electrically connected to the second node N2. The reset transistor M5 has a gate electrode electrically connected to the third scanning signal terminal S3, a first terminal electrically connected to the reset signal terminal Vref, and a second terminal electrically connected to the anode of the light-emitting element OL. A cathode of the light-emitting element OL is electrically connected to the second power signal terminal PV2. The bias adjustment transistor M6 has a gate electrode electrically connected to the third scanning signal terminal S3, a first terminal electrically connected to the bias signal terminal Dv, and a second terminal electrically connected to the third node N3. The bias adjustment transistor M6 is configured to adjust a bias state of the driving transistor Tm. Further, in the embodiment shown in FIG. 7, the gate electrode of the bias adjustment transistor M6 and the gate electrode of the reset transistor M5 are both connected to the third scanning signal terminal S3, that is, the light-emitting element OL is reset while the driving transistor Tm is biased. In another embodiment, the gate electrode of the bias adjustment transistor M6 and the gate electrode of the reset transistor M5 are connected to different signal terminals, so that the bias adjustment of the driving transistor Tm and the reset of the light-emitting element OL can be performed at different moments.

In an embodiment shown in FIG. 7, the threshold compensation transistor M1 is a P-type transistor, and the driving transistor and other switching transistors in the pixel circuit are all N-type transistors. The pixel circuit includes a second capacitor C2 having a fourth plate c24 connected to the third node N3 and a third plate c23 connected to the light-emission control terminal E. The second capacitor C2 is configured to reversely bias the driving transistor. Referring to FIG. 24, at the moment when the signal of the light-emission control terminal E is a rising edge, the second capacitor C2 can pull up the potential at the third node N3. When the pixel circuit operates in a light-emitting phase, the potential at the first node N1 is higher than the potential at the third node N3, and thus the driving transistor Tm produces a hysteresis effect, which results in a threshold voltage shift of the driving transistor. In this embodiment, the second capacitor C2 can pull up the potential at the third node N3 at the moment when the signal of the light-emission control terminal E is a rising edge, realizing the reverse bias of the driving transistor, thereby compensating for the threshold voltage shift caused by the hysteresis effect of the driving transistor.

In an embodiment shown in FIG. 22, the threshold compensation transistor M1 is a P-type transistor, and the driving transistor and other switching transistors in the pixel circuit are all N-type transistors. As shown in FIG. 24, in an embodiment, the gate electrode of the driving transistor Tm (i.e., the first gate electrode g1 of the first transistor T1) is reused as the first plate c11 of the first capacitor C1. The second plate of the first capacitor C1 is located in the second metal layer M2. The fourth plate c24 is located in the same layer as the active layer of the driving transistor Tm (i.e., the first active layer w1 of the first transistor T1), and the third plate c23 is located in the same layer as the first gate electrode g1 of the first transistor T1. In an embodiment, the layers where the plates of the two capacitors are located can be selected according to the connection relationship of the two capacitors in the pixel circuit with other transistor devices, thereby simplifying the wirings of the pixel circuit in the display panel and saving space.

In an embodiment, in view of FIG. 7, the pixel circuit further includes a second auxiliary transistor. The second auxiliary transistor has a gate electrode and a first terminal that are both electrically connected to the light-emission control terminal, and a second terminal connected to one plate of the second capacitor C2, which are not specifically shown in the drawings. The second auxiliary transistor is a P-type transistor, and in an embodiment, an active layer of the second auxiliary transistor contains oxide semiconductor. In this embodiment, the second auxiliary transistor is controlled by the light-emission control terminal, so as to ensure that the second auxiliary transistor is switched on to pull up the potential at the third node N3 and to adjust the bias state of the driving transistor Tm, only when the signal of the light-emission control terminal is a rising edge.

In an embodiment, the first capacitor C1 and the second capacitor C2 are included in the driving array layer 101. A first insulation layer 31 is provided between the first plate c11 and the second plate c12, and a second insulation layer 32 is provided between the third plate c23 and the fourth plate c24. In other embodiments, other insulation layers can also be provided between the first plate c11 and the second plate c12, and other insulation layers may also be provided between the third plate c23 and the fourth plate c24.

As shown in FIG. 18, a first insulation layer 31 is provided between the first plate c11 and the second plate c12, and a second insulation layer 32 is provided between the third plate c23 and the fourth plate c24. The first insulation layer 31 has a higher hydrogen content than the second insulation layer 32. In the embodiment where the first capacitor C1 is the storage capacitor of the pixel circuit and the second capacitor C2 is the auxiliary capacitor, the first plate c11 of the first capacitor C1 is located in the first metal layer M1, and the second plate c12 is located in the second metal layer M2, the first capacitor C1 is closer to the first transistor (i.e., the driving transistor), and the first active layer of the first transistor T1 contains silicon. By providing the first insulation layer 31 with the higher hydrogen content, when the first active layer w1 is subjected to a hydrogenation process, the first insulation layer 31 can provide hydrogen ions for the first active layer w1, enriching the first active layer w1 of the first transistor T1 with hydrogen to ensure the driving performance of the first transistor. In addition, the third plate c23 is located in the same layer as the second active layer w2 of the second transistor T2, and the fourth plate c24 is located in the first metal layer M1, and thus the second capacitor C2 is closer to the second transistor T2. The second active layer w2 of the second transistor T2 contains oxide semiconductors. In order to ensure the performance of the second transistor T2, the second active layer w2 is required to be rich in oxygen. If the insulation layer close to the second active layer w2 has higher hydrogen content, the oxide semiconductor will easily become conductive. In this embodiment, as the second insulation layer 32 between the plates of the second capacitor C2 has lower hydrogen content, the second active layer w2 of the second transistor T2 is prevented from being adversely affected by the second insulation layer 32, thereby guaranteeing the performance stability of the second transistor T2.

In addition, the first insulation layer 31 has a lower oxygen content than the second insulation layer 32. In the embodiment where the first capacitor C1 is closer to the first transistor T1 and the second capacitor C2 is closer to the second transistor T2, since the first insulation layer 31 has the lower oxygen content, oxygen in the first insulation layer 31 is less bonded to hydrogen in the first active layer w1, enabling the first active layer w1 to be rich in oxygen, thereby guaranteeing the performance stability of the first transistor T1. In the meantime, since the second insulation layer 32 has a higher oxygen content, it is avoided that the second active layer w2 is conductorized to affect the device performance.

In another embodiment, further referring to the above shown in FIG. 18, a first insulation layer 31 and a second insulation layer 32 that are stacked, are provided between the third plate c23 and the fourth plate c24. As shown in FIG. 18, the first insulation layer 31 is located on a side close to the fourth plate c24, and the second insulation layer 32 is located on a side close to the third plate c23. In another embodiment, the two plates of the second capacitor are different from those shown in the FIG. 18 in that the positions of the first insulation layer and the second insulation layer are interchanged. The first insulation layer and the second insulation layer can cooperate to meet the requirements for the capacitance of the second capacitor in the circuit structure and the hydrogen or oxygen content on the side close to the active layer of the transistor, while satisfying both capacitive performance and transistor stability.

In an embodiment, the first insulation layer 31 is made of a material containing silicon nitride, the second insulation layer 32 is made of a material containing silicon oxide. In this way, it can be realized that the oxygen content of the first insulation layer is smaller than the oxygen content of the second insulation layer, and the hydrogen content of the first insulation layer is greater than the hydrogen content of the second insulation layer.

In an embodiment, in the insulation layer between the third plate and the fourth plate, the oxygen content close to the third plate is greater than that close to the fourth plate, and the hydrogen content close to the third plate is smaller than that close to the fourth plate. In practice, the insulation layer between the plates of the second capacitor can be set according to the connection relationship of the second capacitor with other circuit elements in the circuit structure and the requirements for the capacitance of the second capacitor. One or more insulation layers can be provided between the third plate and the fourth plate. Since the oxygen content close to the third plate is greater than that close to the fourth plate in the insulation layer located between the third plate and the fourth plate, the third plate can be provided close to the second active layer of the second transistor, and the oxygen in the insulation layer close to the third plate can be bonded with free hydrogen to reduce a bonding of free hydrogen with the second active layer, thereby enriching the second active layer with oxygen to ensure the stability of the second transistor. Since the hydrogen content close to the fourth plate is greater than that close to the third plate in the insulation layer located between the third plate and the fourth plate, the fourth plate can be placed close to the first active layer of the first transistor, and the hydrogen in the insulation layer close to the fourth plate can provide hydrogen ions for the first active layer to enrich the first active layer of the first transistor with hydrogen, thereby ensuring the driving performance of the first transistor.

In an embodiment, a first insulation layer is provided between the first plate and the second plate, a second insulation layer is provided between the third plate and the fourth plate, and the first insulation layer has a smaller thickness than the second insulation layer. According to the capacitance formula, the smaller the thickness of the insulation layer, the greater the capacitance formed between the two plates. By setting the thickness of the first insulation layer to be smaller than the thickness of the second insulation layer, the capacitance of the first capacitor is advantageously greater than the capacitance of the second capacitor. When the capacitance of the first capacitor is ensured to be great enough, the area occupied by the first capacitor can be reduced to a certain extent, which is beneficial to saving the space occupied by the pixel circuit. When the pixel circuit includes the first capacitor, the space occupied by the pixel circuit can be reduced, which is beneficial to increasing the pixel density and improving the resolution of the display panel. When the driving circuit includes a first capacitor, the space occupied by the driving circuit can be reduced, which is beneficial to reducing the area of the non-display area and increasing the screen-to-body ratio.

In an embodiment, a first insulation layer is provided between the first plate and the second plate, a second insulation layer is provided between the third plate and the fourth plate, and the first insulation layer has a greater dielectric constant than the second insulation layer. The greater the dielectric constant between the two plates of the capacitor, the greater the capacitance formed between the two plates. By setting the dielectric constant of the first insulation layer to be greater than the dielectric constant of the second insulation layer, the capacitance of the first capacitor is advantageously greater than the capacitance of the second capacitor. The capacitances of the capacitors are differentiated by adjusting the material of the insulation layer between the two plates of the capacitor.

In an embodiment, the first plate and the second plate both have greater area than the third plate and the fourth plate. In this embodiment, the capacitance of the first capacitor can be greater than the capacitance of the second capacitor by adjusting the area of the plates of the first capacitor. In the embodiment in which the driving circuit includes the first capacitor, as the driving circuit is arranged in the non-display area, the display area will not be affected even when the plates of the first capacitor in the driving circuit have a relatively large area.

In another embodiment, the first plate and the third plate are located in the same functional layer, the second plate and the fourth plate are located in the same functional layer; a first insulation layer is provided between the first plate and the second plate, and a second insulation layer is provided between the third plate and the fourth plate; and a hydrogen content in the first insulation layer is different from that in the second insulation layer. In the embodiment where any one of the pixel circuit and the driving circuit includes the first capacitor and the other one includes the second capacitor, the hydrogen content of the insulation layers between the plates of capacitors can be different due to the difference in the manufacturing processes of the pixel circuit and the driving circuit. In an embodiment, the hydrogen content of the first insulation layer is greater than the hydrogen content of the second insulation layer. In another embodiment, the hydrogen content of the first insulation layer is smaller than the hydrogen content of the second insulation layer. When applied in different circuit structures, the hydrogen content of the first insulation layer and the hydrogen content of the second insulation layer can be flexibly set according to specific process requirements.

Figure 25:
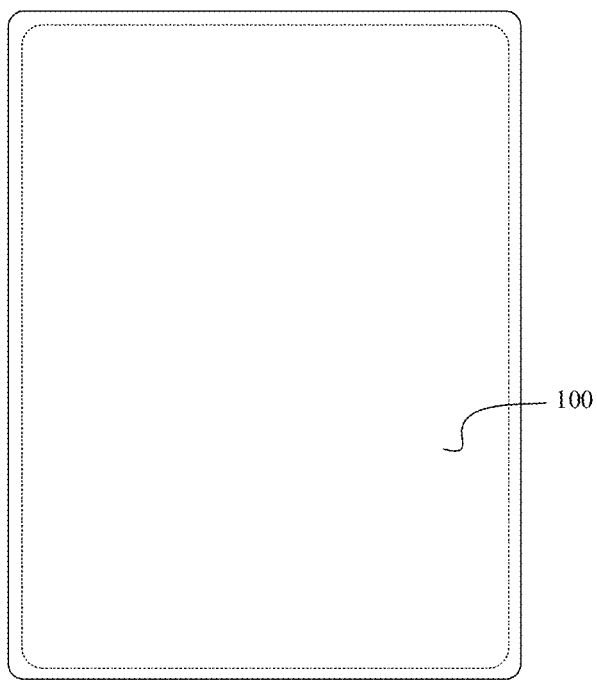
FIG. 25 is a schematic diagram of a display apparatus according to an embodiment of the present disclosure.

The embodiments of the present disclosure further provide a display apparatus. FIG. 25 is a schematic diagram of a display apparatus according to an embodiment of the present disclosure. For example, as shown in FIG. 25, the display apparatus includes the display panel 100 according to any one of the above-mentioned embodiments of the present disclosure. The structure of the display panel is described in detail in the foregoing embodiments, which will not be repeated herein. The display apparatus according to the present embodiment of the present disclosure can be any apparatus having a display function, such as a mobile phone, a tablet computer, a notebook computer, an electronic paper book, a television, a smart wearable product, etc.

The above are merely exemplary embodiments of the present disclosure, but are not intended to limit the present disclosure. Any modification, equivalent replacement, improvement, etc., made within the spirit and principle of the present disclosure shall fall within the protection scope of the present disclosure.

It should be understood that the above embodiments are only intended to illustrate, but not to limit, the technical solutions of the present disclosure. Although the present technology is described in detail with reference to the preferred embodiments as above, those skilled in the art can still modify the technical solutions described in the foregoing embodiments, or equivalently replace some or all of the technical features.

What is claimed is:
1. A display panel, comprising:
a base substrate; and
a driving array layer disposed on the base substrate and having functional layers and insulation layers,
wherein the driving array layer comprises:
a first transistor, wherein the first transistor comprises a first active layer comprising silicon;
a second transistor, wherein the second transistor comprises a second active layer comprising oxide semiconductor;
a first capacitor comprising a first plate and a second plate; and
a second capacitor comprising a third plate and a fourth plate,
wherein a first insulation layer is provided between the first plate and the second plate, and a second insulation layer is provided between the third plate and the fourth plate;
the first transistor comprises a first gate electrode, a first source electrode, a first drain electrode and the first active layer, wherein the first gate electrode is located at a side of the first active layer away from the base substrate;
the second transistor comprises a second gate electrode, a third gate electrode, a second source electrode, a second drain electrode and the second active layer, wherein the second gate electrode is located between the second active layer and the base substrate; and the third gate electrode is located at a side of the second active layer away from the base substrate; and the first gate electrode is located in a first metal layer, the second gate electrode is located in a second metal layer, and the third gate electrode is located in a third metal layer.

2. The display panel according to claim 1, wherein the first insulation layer has a greater hydrogen content than the second insulation layer.

3. The display panel according to claim 1, wherein the first plate is located between the second plate and the base substrate; the fourth plate is located on a side of the third plate away from the base substrate; the first plate and the second plate are located in two of the functional layers; and the third plate and the fourth plate are located in two of the functional layers.

4. The display panel according to claim 3, wherein the first plate and the third plate are located in a same function layer of the functional layers; and the second plate and the fourth plate are located in different functional layers of the functional layers.

5. The display panel according to claim 4, wherein the driving array layer comprises a pixel circuit, wherein the pixel circuit comprises the first capacitor and the second capacitor, and wherein the first capacitor has a greater capacitance than the second capacitor.

6. The display panel according to claim 5, wherein each of an area of the first plate and an area of the second plate is greater than each of an area of the third plate and an area of the fourth plate.

7. The display panel according to claim 1, wherein the first plate and the third plate are located in the first metal layer, the second plate is located in the second metal layer, and the fourth plate and the second active layer are located in a same layer.

8. The display panel according to claim 7, wherein the second capacitor further comprises a fifth plate connected to the third plate or the fourth plate and located on a side of the fourth plate that is facing away from the third plate.

9. The display panel according to claim 7, wherein the first insulation layer has a lower oxygen content than the second insulation layer.

10. The display panel according to claim 7, wherein the first insulation layer has a smaller thickness than the second insulation layer.

11. The display panel according to claim 1, wherein the first insulation layer and the second insulation layer are provided between the third plate and the fourth plate, wherein the first insulation layer is located at a side of the second insulation layer close to the third plate, the second insulation layer is located between the first insulation layer and the fourth plate, and the first insulation layer has a lower oxygen content than the second insulation layer.

12. The display panel according to claim 1, wherein the driving array layer comprises a pixel circuit, and the pixel circuit comprises a driving transistor, a first light-emission control transistor, a light-emission control terminal, and the second capacitor;
the first light-emission control transistor comprises a gate electrode electrically connected to the light-emission control terminal, a first terminal electrically connected to a third node of a terminal of the driving transistor, and a second terminal electrically connected to an anode of a light-emitting element; and
the third plate is connected to the light-emission control terminal, the fourth plate is connected to the third node, and the second capacitor is configured to reversely bias the driving transistor.

13. A display panel, comprising:
a base substrate; and
a driving array layer disposed on the base substrate and having functional layers and insulation layers,
wherein the driving array layer comprises:
a first transistor, wherein the first transistor comprises a first active layer comprising silicon;
a second transistor, wherein the second transistor comprises a second active layer comprising oxide semiconductor;
a first capacitor comprising a first plate and a second plate; and
a second capacitor comprising a third plate and a fourth plate,
wherein a first insulation layer is provided between the first plate and the second plate, and a second insulation layer is provided between the third plate and the fourth plate;
wherein the driving array layer comprises:
a pixel circuit comprising the second capacitor; and
a driving circuit configured to provide a control signal to the pixel circuit and comprising the first capacitor,
wherein the first capacitor has a greater capacitance than the second capacitor; and
wherein the pixel circuit comprises the first capacitor, and the driving circuit comprises the second capacitor; and an orthographic projection of the second capacitor on a plane of the display panel partially overlaps an orthographic projection of the first transistor on the plane of the display panel, and an orthographic projection of the first capacitor on the plane of the display panel partially does not overlap an orthographic projection of the second transistor on the plane of the display panel; or
the pixel circuit comprises the first transistor, and the driving circuit comprises the second transistor, and an area of a region where an orthographic projection of the second capacitor on a plane of the display panel overlaps an orthographic projection of the first transistor of the pixel circuit on the plane of the display panel is greater than an area of a region where an orthographic projection of the first capacitor on the plane of the display panel overlaps an orthographic projection of the second transistor on the plane of the display panel.

14. The display panel according to claim 13, wherein the pixel circuit comprises the first transistor and a third transistor, and the driving circuit comprises the second transistor and a fourth transistor,
wherein the third transistor comprises a third active layer comprising oxide semiconductor,
the fourth transistor comprises a fourth active layer comprising silicon,
a channel region of the first transistor has a width of W1 and a length of L1;
a channel region of the second transistor has a width of W2 and a length of L2;
a channel region of the third transistor has a width of W3 and a length of L3; and
a channel region of the fourth transistor has a width of W4 and a length of L4.

15. The display panel according to claim 14, wherein each of the first transistor and the third transistor is a switching transistor of the pixel circuit, where |W1/L1-W4/L4|<|W2/L2-W3/L3|.

16. The display panel according to claim 14, wherein the first transistor is a driving transistor of the pixel circuit, and the third transistor is a switching transistor of the pixel circuit, where |W1/L1-W4/L4|>5*|W2/L2-W3/L3|; or wherein the first transistor is a switching transistor of the pixel circuit, and the third transistor is a driving transistor of the pixel circuit, where $5*|W1/L1-W4/L4|<|W2/L2-W3/L3|$.

17. A display apparatus, comprising:
a display panel, comprising a base substrate and a driving array layer, the driving array layer being disposed on the base substrate and having functional layers and insulation layers,
wherein the driving array layer comprises:
a first transistor, wherein the first transistor comprises a first active layer comprising silicon;
a second transistor, wherein the second transistor comprises a second active layer comprising oxide semiconductor;
a first capacitor comprising a first plate and a second plate; and
a second capacitor comprising a third plate and a fourth plate,
wherein a first insulation layer is provided between the first plate and the second plate, and a second insulation layer is provided between the third plate and the fourth plate; and the first insulation layer has a greater hydrogen content than the second insulation layer;
the first transistor comprises a first gate electrode, a first source electrode, a first drain electrode and the first active layer, wherein the first gate electrode is located at a side of the first active layer away from the base substrate;
the second transistor comprises a second gate electrode, a third gate electrode, a second source electrode, a second drain electrode and the second active layer, wherein the second gate electrode is located between the second active layer and the base substrate; and the third gate electrode is located at a side of the second active layer away from the base substrate; and
the first gate electrode is located in a first metal layer, the second gate electrode is located in a second metal layer, and the third gate electrode is located in a third metal layer.

* * * * *